(12) United States Patent
Onishi et al.

(10) Patent No.: US 8,357,989 B2
(45) Date of Patent: Jan. 22, 2013

(54) SEMICONDUCTOR DEVICE AND METHOD FOR MANUFACTURING THE SAME

(75) Inventors: Kazuma Onishi, Itami (JP); Yoshitaka Otsu, Itami (JP); Hiroshi Kimura, Kanagawa (JP); Tetsuya Nitta, Kanagawa (JP); Shinichiro Yanagi, Kanagawa (JP); Katsumi Morii, Itami (JP)

(73) Assignee: Renesas Electronics Corporation, Kanagawa (JP)

( * ) Notice: Subject to any disclaimer, the term of this patent is extended or adjusted under 35 U.S.C. 154(b) by 140 days.

(21) Appl. No.: 12/882,863

(22) Filed: Sep. 15, 2010

(65) Prior Publication Data

US 2011/0062547 A1 Mar. 17, 2011

(30) Foreign Application Priority Data

Sep. 15, 2009 (JP) ................................. 2009-213345

(51) Int. Cl.
 *H01L 29/00* (2006.01)
 *H01L 21/76* (2006.01)

(52) U.S. Cl. ... 257/510; 257/397; 257/647; 257/E29.02; 438/421; 438/424; 438/700; 438/778

(58) Field of Classification Search .......... 257/395–397, 257/510, 524, 620, 647, E29.018, E29.02; 438/421, 422, 424, 700, 778
See application file for complete search history.

(56) References Cited

U.S. PATENT DOCUMENTS

| | | | |
|---|---|---|---|
| 6,184,566 B1 * | 2/2001 | Gardner et al. | 257/510 |
| 6,621,136 B2 * | 9/2003 | Grivna | 257/510 |
| 8,056,756 B2 * | 11/2011 | Okiyama | 220/724 |
| 2010/0035403 A1 * | 2/2010 | Brown et al. | 438/422 |

FOREIGN PATENT DOCUMENTS

JP 2002-118256 4/2002

* cited by examiner

*Primary Examiner* — Matthew E Warren
(74) *Attorney, Agent, or Firm* — McDermott Will & Emery LLP

(57) ABSTRACT

A semiconductor device which eliminates the need for high fillability through a simple process and a method for manufacturing the same. A high breakdown voltage lateral MOS transistor including a source region and a drain region is completed on a surface of a semiconductor substrate. A trench which surrounds the transistor when seen in a plan view is made in the surface of the semiconductor substrate. An insulating film is formed over the transistor and in the trench so as to cover the transistor and form an air-gap space in the trench. Contact holes which reach the source region and drain region of the transistor respectively are made in an interlayer insulating film.

9 Claims, 24 Drawing Sheets

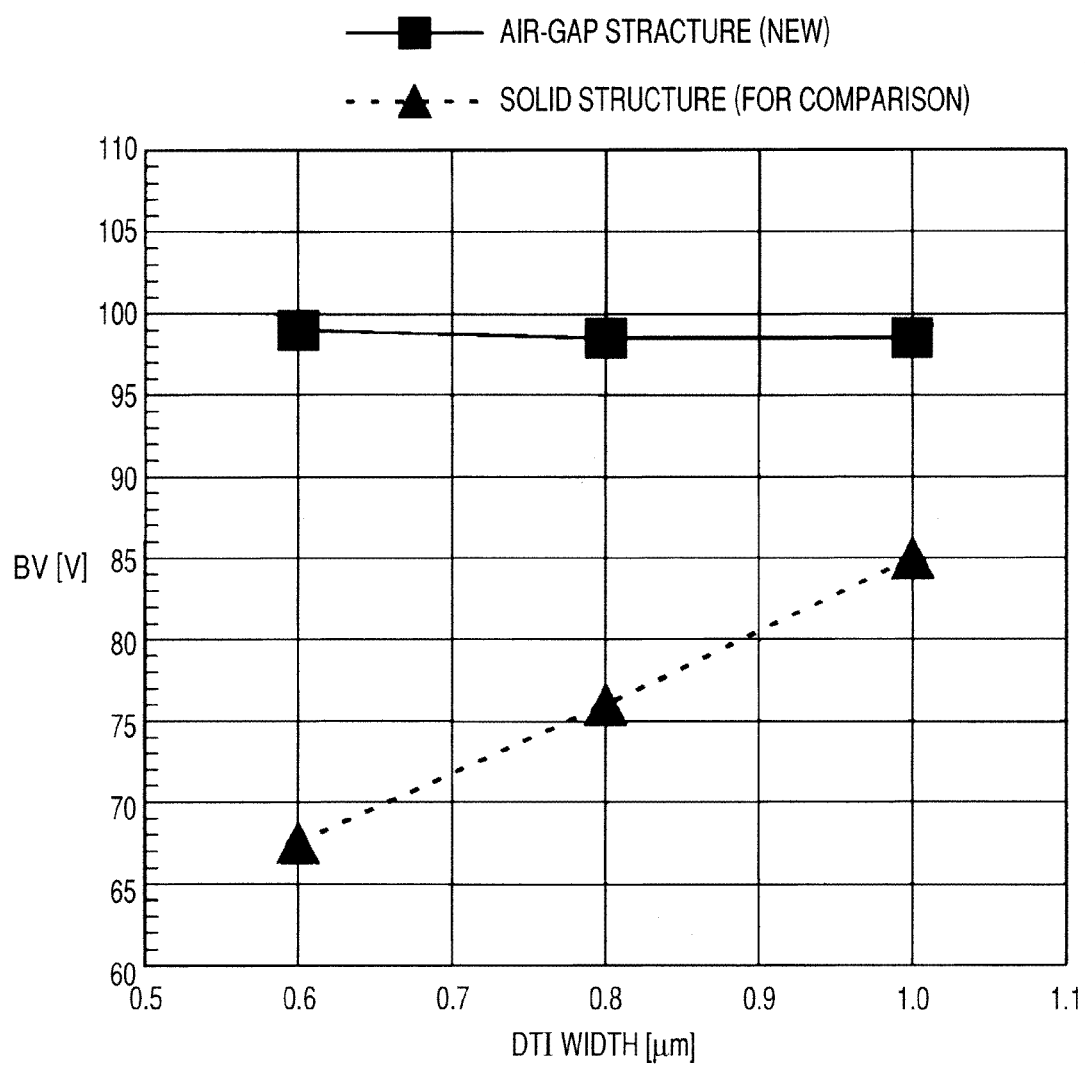

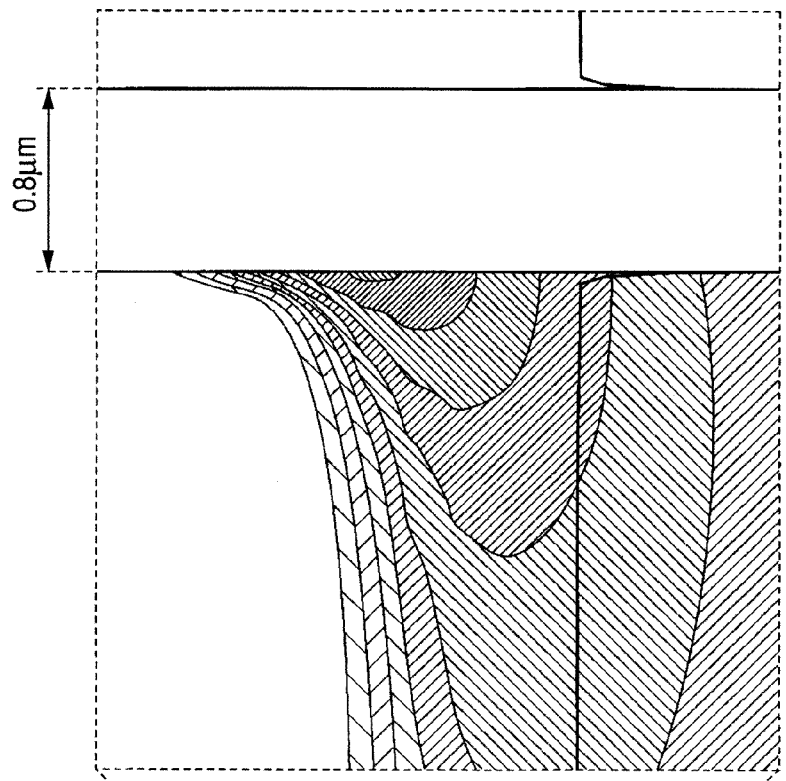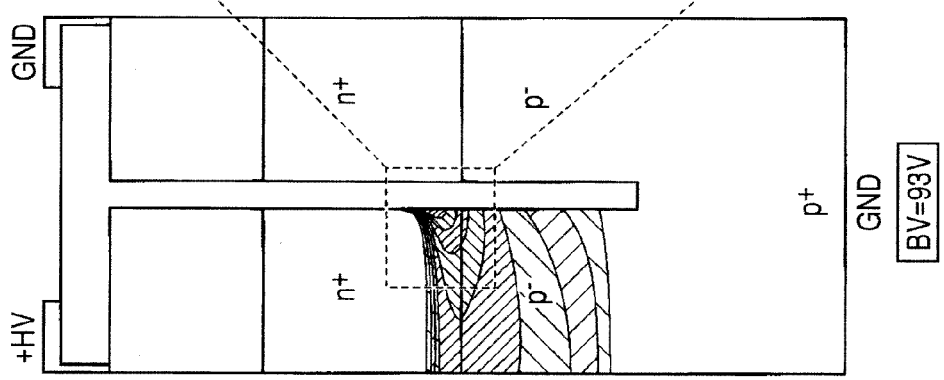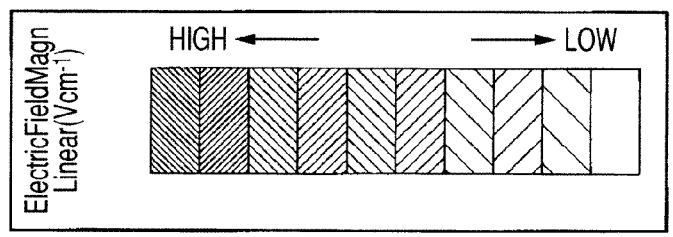

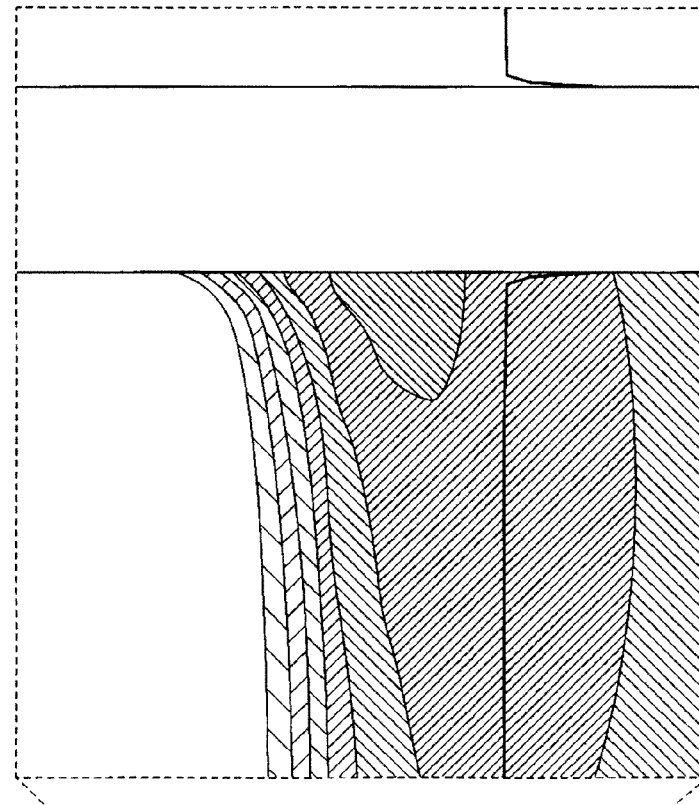
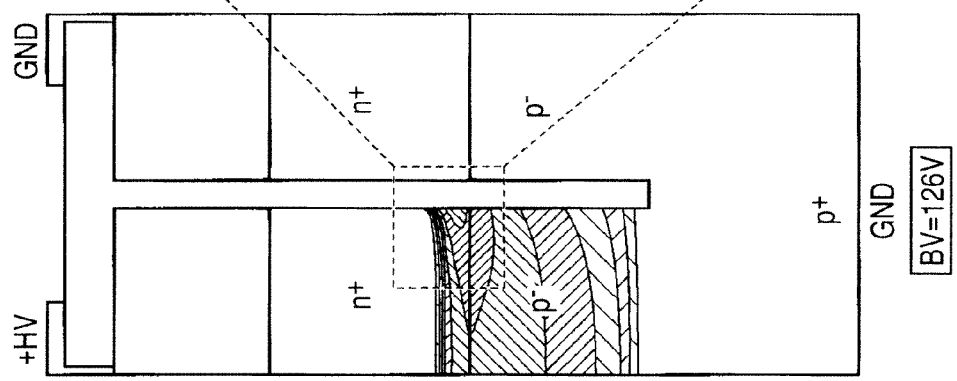
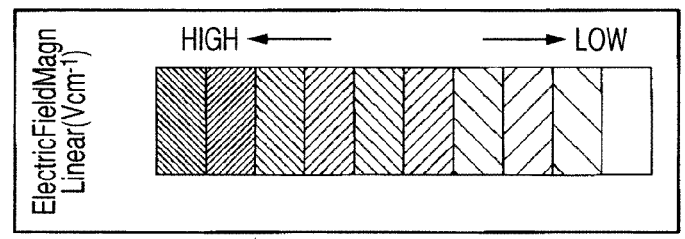
FIG. 17(A)
FIG. 17(B)

SEMICONDUCTOR DEVICE AND METHOD FOR MANUFACTURING THE SAME

CROSS-REFERENCE TO RELATED APPLICATIONS

The disclosure of Japanese Patent Application No. 2009-213345 filed on Sep. 15, 2009, including the specification, drawings and abstract, is incorporated herein by reference in its entirety.

BACKGROUND OF THE INVENTION

The present invention relates to a semiconductor device and a method for manufacturing the same and more particularly to a semiconductor device having a trench and a method for manufacturing the same.

A device isolation (deep trench isolation, or DTI) structure in which insulating film is filled in a trench with a high aspect ratio is disclosed in Japanese Unexamined Patent Publication No. 2002-118256.

In the technique described therein, a trench is first made in a surface of a semiconductor substrate and then a first insulating film is formed over the surface of the semiconductor substrate in a manner to fill the trench. An opening which reaches the first insulating film is made by anisotropic etching of the first insulating film, where the upper end corner of the opening of the first insulating film has a more gradual inclination than the upper end corner of the trench. The above anisotropic etching process also reduces the thickness of the first insulating film lying over the semiconductor substrate surface. After that, a second insulating film is formed over the semiconductor substrate surface in a manner to fill the opening.

After a DTI structure was formed as mentioned above, an electronic device such as a MOSFET (metal oxide semiconductor field effect transistor) is formed on the semiconductor substrate.

SUMMARY OF THE INVENTION

In the above technique, it is necessary to fill the high aspect-ratio trench with the first and second insulating films. This means that an insulating film deposition process must be performed twice and an anisotropic etching process to expand the upper end of the opening must also be performed, resulting in a longer flow time and an increase in processing time and cost.

In addition, if there is an air-gap space in the trench, the air-gap space may become exposed on the substrate surface by a subsequent wet process. If the air-gap space in the trench is exposed on the substrate surface, photo-resist may get into the air-gap space through its exposed portion and become unremovable. The photo-resist in the air-gap space may spout and appear as a foreign substance in a later process, causing a pattern defect.

The present invention has been made in view of the above problem and has an object to provide a semiconductor device which eliminates the need for high fillability through a simple process and a method for manufacturing the same.

According to one aspect of the present invention, a method for manufacturing a semiconductor device includes the following steps. First, a device having a conductive portion is completed on the main surface of a semiconductor substrate. Then, a first trench which surrounds the device when seen in a plan view is made in the main surface of the semiconductor substrate. An insulating film is formed over the device and in the first trench so as to cover the device and make an air-gap space in the first trench. Then, a hole which reaches the conductive portion of the device is made in the insulating film.

According to this aspect of the invention, the first trench is made after completion of the device, so there is no possibility that photo-resist may get into the first trench in the course of making the device. Therefore, a semiconductor device which eliminates the need for high fillability through a simple process and a method for manufacturing the same can be realized.

BRIEF DESCRIPTION OF THE DRAWINGS

FIG. 15 shows the result of a test in which the breakdown voltage was measured when the width of the DTI structure of the sample shown in FIG. 13 was changed;

FIG. 16A shows the field intensity distribution at breakdown when there is no air-gap space in the trench of the DTI structure in the sample shown in FIG. 13 and FIG. 16B is a partially enlarged view thereof;

FIG. 17A shows the field intensity distribution at breakdown when there is an air-gap space in the trench of the DTI structure in the sample shown in FIG. 13 and FIG. 17B is a partially enlarged view thereof;

DETAILED DESCRIPTION OF THE PREFERRED EMBODIMENTS

Next, the preferred embodiments of the present invention will be described referring to the accompanying drawings.

First Embodiment

Figure 1:
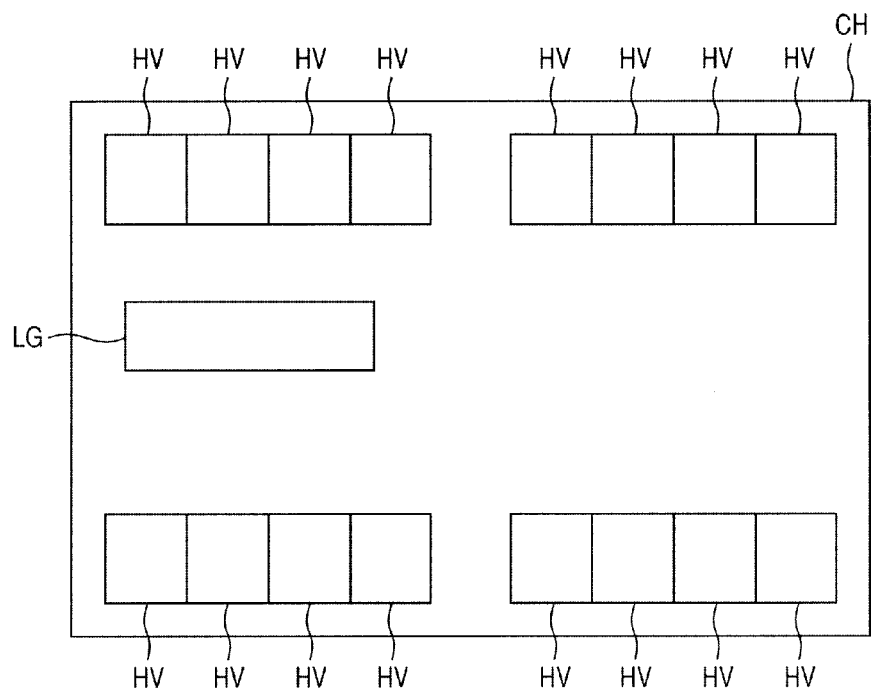
FIG. 1 is a schematic plan view showing the structure of a semiconductor device according to a first embodiment of the present invention in the form of a chip.

Referring to FIG. 1, a BiC-DMOS (bipolar complementary double-diffused metal oxide semiconductor) chip CH has a logic section LG, for example, as an integration of low breakdown voltage CMOS (complementary MOS) transistors, and output drivers HV which use high breakdown voltage devices. The region in which the logic section LG is formed is surrounded by a DTI structure when seen in a plan view. In the output drivers HV, each device formation region is surrounded by a DTI structure when seen in a plan view.

Figure 2:
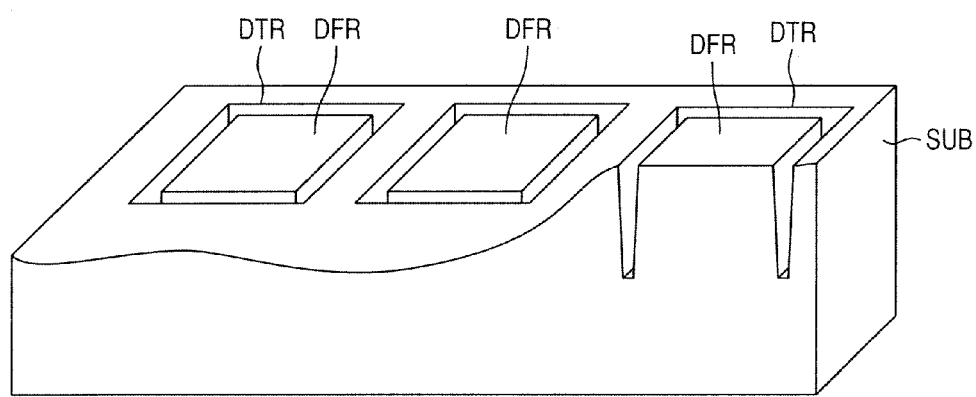
FIG. 2 is a partially sectional perspective view showing a device formation region shown in FIG. 1 as surrounded by a trench when viewed in a plan view.

Referring to FIG. 2, in the output drivers HV, the device formation region DFR for each high breakdown voltage device is surrounded by a trench DTR configuring a DTI structure when seen in a plan view. This trench DTR is formed in a surface of a semiconductor substrate SUB.

Next, a case that a high breakdown voltage lateral MOS transistor is used as the high breakdown voltage device will be explained.

Figure 3:
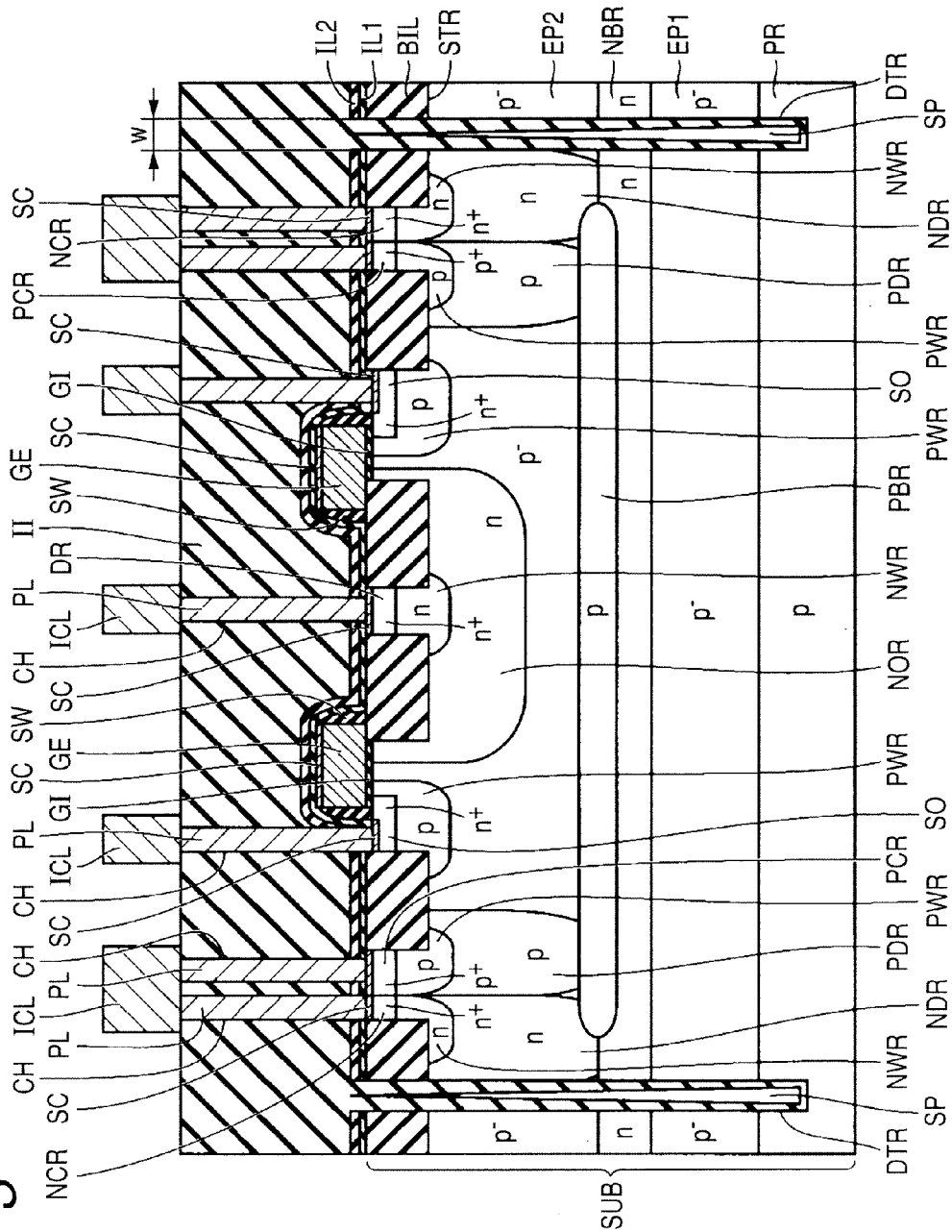
FIG. 3 is a schematic sectional view showing the structure of the semiconductor device according to the first embodiment as a device surrounded by the trench as shown in FIG. 2.

Referring to FIG. 3, the semiconductor substrate SUB is, for example, made of silicon and selectively has a trench STR in its main surface. A buried insulating layer BIL is formed in this trench STR. This trench STR and buried insulating layer BIL make up an STI (shallow trench isolation) structure.

A $p^-$ epitaxial region EP1 and an n-type buried region NBR are formed over a p-type region PR of the semiconductor substrate SUB. A p-type buried region PBR is selectively formed over the n-type buried region NBR. A $p^-$ epitaxial region EP2 is formed over the n-type buried region NBR and p-type buried region PBR.

A high breakdown voltage lateral MOS transistor is formed on the surface of the semiconductor substrate SUB in the $p^-$ epitaxial region EP2. This high breakdown voltage lateral MOS transistor mainly has an n-type offset region NOR, an n-type well region NWR, a p-type well region PWR, an $n^+$ drain region DR, an $n^+$ source region SO, a gate insulating film GI and a gate electrode layer GE.

The n-type offset region NOR is formed on the surface of the semiconductor substrate SUB in a manner to make up a pn junction in combination with the $p^-$ epitaxial region EP2. The n-type well region NWR is formed in a manner to contact the n-type offset region NOR and the $n^+$ drain region DR is formed on the surface of the semiconductor substrate SUB in a manner to contact the n-type well region NWR.

The p-type well region PWR is formed on the surface of the semiconductor substrate SUB in the $p^-$ epitaxial region EP2. The $n^+$ source region SO is formed on the surface of the semiconductor substrate SUB in a manner to make up a pn junction in combination with the p-type well region PWR. The p-type well region PWR and $p^-$ epitaxial region EP2 lie between the $n^+$ source region SO and n-type offset region NOR along the surface of the semiconductor substrate SUB.

The gate electrode layer GE is formed over the semiconductor substrate SUB in a manner to face, through the gate insulating film GI, the p-type well region PWR and $p^-$ epitaxial region EP2 lying between the $n^+$ source region SO and n-type offset region NOR. One end of the gate electrode layer GE lies over the STI structure formed in the n-type offset region NOR. A side wall insulating film SW is formed in a manner to cover the side wall of the gate electrode layer GE.

In this embodiment, it is preferable that a silicide layer SC be formed over the surfaces of the $n^+$ source region SO, $n^+$ drain region DR and gate electrode layer GE, although this silicide layer SC is omissible.

In the $p^-$ epitaxial region EP2, a p-type sinker region PDR is formed in a manner to contact the p-type buried region PBR, where a p-type well region PWR and a p+ contact region PCR are formed near the surface of the semiconductor substrate SUB in the p-type sinker region PDR. For electric isolation between the p+ contact region PCR and $n^+$ source region SO, an STI structure is formed in the surface of the semiconductor substrate SUB between the p+ contact region PCR and $n^+$ source region SO.

In the $p^-$ epitaxial region EP2, an n-type sinker region NDR is formed in a manner to contact the n-type buried region NBR, where an n-type well region NWR and a $n^+$ contact region NCR are formed near the surface of the semiconductor substrate SUB in the n-type sinker region NDR. It is preferable that a silicide layer SC be formed over the surfaces of the $n^+$ contact region NCR and p+ contact region PCR, although such a silicide layer SC is omissible.

An insulating film IL1, an insulating film IL2 and an interlayer insulating film II are stacked in order, covering the high breakdown voltage lateral MOS transistor. For example, the insulating film IL1 is a silicon oxide film and the insulating film IL2 is a silicon nitride film. The interlayer insulating film II is, for example, a laminate comprised of BP-TEOS (boro-phospho-tetra-ethyl-ortho-silicate) and a silicon oxide film formed over it by plasma CVD (chemical vapor deposition). The BP-TEOS (BPSG: boro-phosphate silicate glass) in the interlayer insulating film II should include an impure substance which is at least either a Group-III element or a Group-V element such as P-TEOS (PSG: phosphorus silicon glass) and B-TEOS (BSG: boro silicate glass).

A contact hole CH is made in the insulating film IL', insulating film IL2 and interlayer insulating film II and a plug conductive layer PL is formed in the contact hole CH. An interconnect layer ICL is formed over the interlayer insulating film II. The interconnect layer ICL is electrically coupled through the plug conductive layer PL in the contact hole CH with the conductive portion of the high breakdown voltage lateral MOS transistor MOS (source region SO, drain region DR, contact regions NCR and PCR, gate electrode layer GE and so on).

A DTI structure is formed in a manner to surround the formation region for the high breakdown voltage lateral MOS transistor when seen in a plan view. This DTI structure includes a trench (first trench) DTR extending inward from the surface of the semiconductor substrate SUB, and an insulating film II formed in the trench DTR. The trench DTR is formed so as to penetrate the p⁻ epitaxial region EP2, n-type buried region NBR and p⁻ epitaxial region EP1 from the surface of the semiconductor substrate SUB and reach the p-type region PR.

The insulating film II formed in the trench DTR is part of the interlayer insulating film II formed over the high breakdown voltage lateral MOS transistor. The trench DTR is not completely filled with the insulating film II but there is an air-gap space SP inside the trench DTR.

It is preferable that this air-gap space SP be formed at least in the vicinity of the junction between the n-type buried region NBR and p⁻ epitaxial region EP1. The height of the air-gap space SP may be almost equal to the depth of the trench. It is preferable that the aspect ratio (depth/width W) of the trench DTR be 1 or higher. It is also preferable that the width W of the trench DTR be 0.3 μm or more on the premise that the breakdown voltage is 80 V.

It is also possible that the trench DTR is formed in a region where there is an STI structure. In this case, in a region where the trench STR of the STI structure (second trench) is formed, the trench DTR should be deeper than the trench STR.

Next, a method for manufacturing a semiconductor device which includes a p-channel MOS transistor (hereinafter called a pMOS transistor), a CMOS transistor, and a nonvolatile semiconductor memory as well as a high breakdown voltage lateral MOS transistor according to this embodiment will be described referring to FIGS. 4 to 12.

Figure 4:
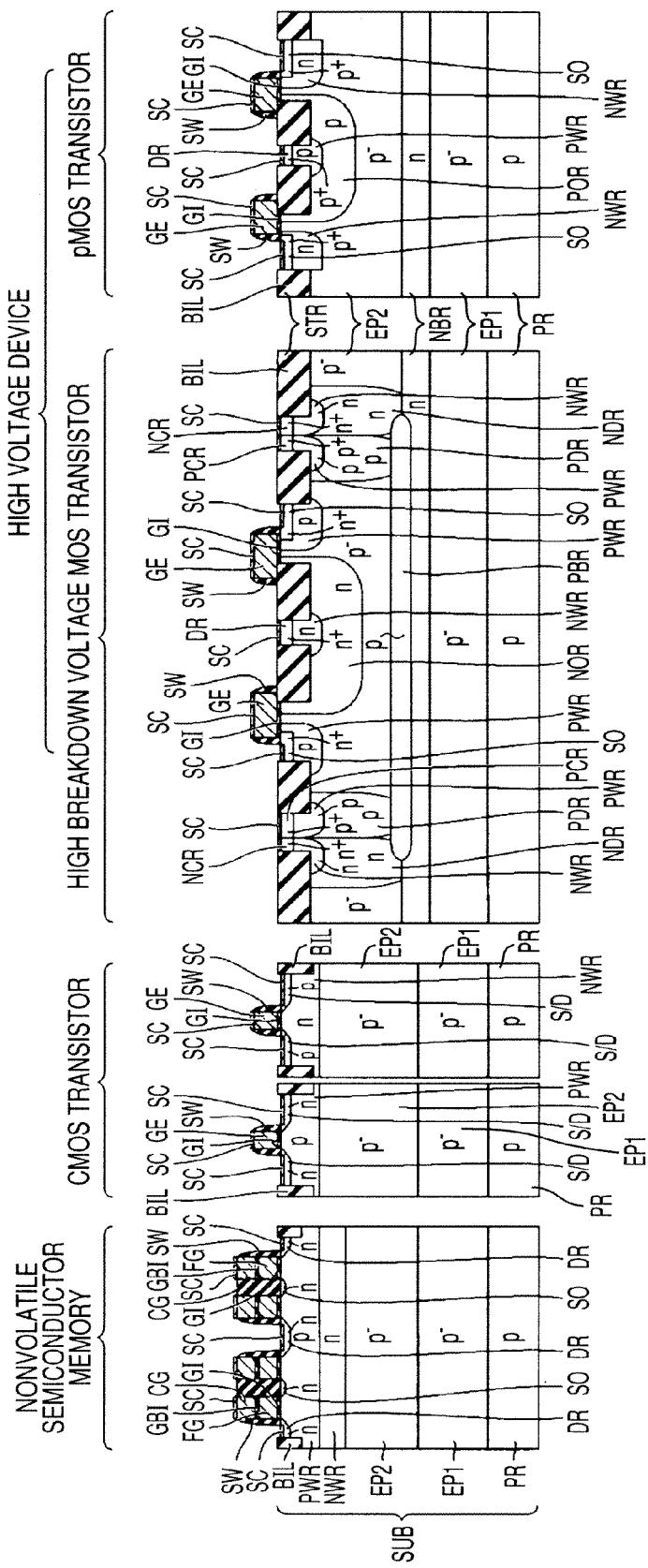
FIG. 4 is a schematic sectional view showing a first step in the method for manufacturing the semiconductor device according to the first embodiment.

Referring to FIG. 4, first of all, various devices (high breakdown voltage lateral MOS transistor, pMOS transistor, CMOS transistor, and nonvolatile semiconductor memory) are completed on the surface of the semiconductor substrate SUB.

The high breakdown voltage lateral MOS transistor includes an n-type offset region NOR, an n-type well region NWR, a p-type well region PWR, an n⁺ drain region DR, an n⁺ source region SO, a gate insulating film GI, and a gate electrode layer GE.

The pMOS transistor as a high breakdown voltage device includes a p-type offset region POR, an n-type well region NWR, a p-type well region PWR, a p+ drain region DR, a p+ source region SO, a gate insulating film GI, and a gate electrode layer GE.

The CMOS transistor is formed so as to complete the pMOS transistor and nMOS transistor. The pMOS transistor includes an n-type well region NWR, a pair of LDL (lightly doped drain) p-type source/drain regions S/D, a gate insulating film GI, and a gate electrode layer GE. The nMOS transistor includes a p-type well region PWR, a pair of LDL n-type source/drain regions S/D, a gate insulating film GI, and a gate electrode layer GE.

The nonvolatile semiconductor memory uses, for example, a stack gate type memory transistor. The stack gate type memory transistor includes a p-type well region PWR, an LDD n-type drain region DR, an n– source region SO, a gate insulating film GI, a floating gate electrode layer FG, an inter-gate insulating film GBI, and a control gate electrode layer CG.

A silicide layer SC may be formed on the surfaces of impurity regions such as the source regions and drain regions of these devices and on the surfaces of the gate electrodes. Also, side wall insulating layers SW are formed so as to cover the side walls of the gate electrode layers GE, FG and CG of the devices.

Figure 5:
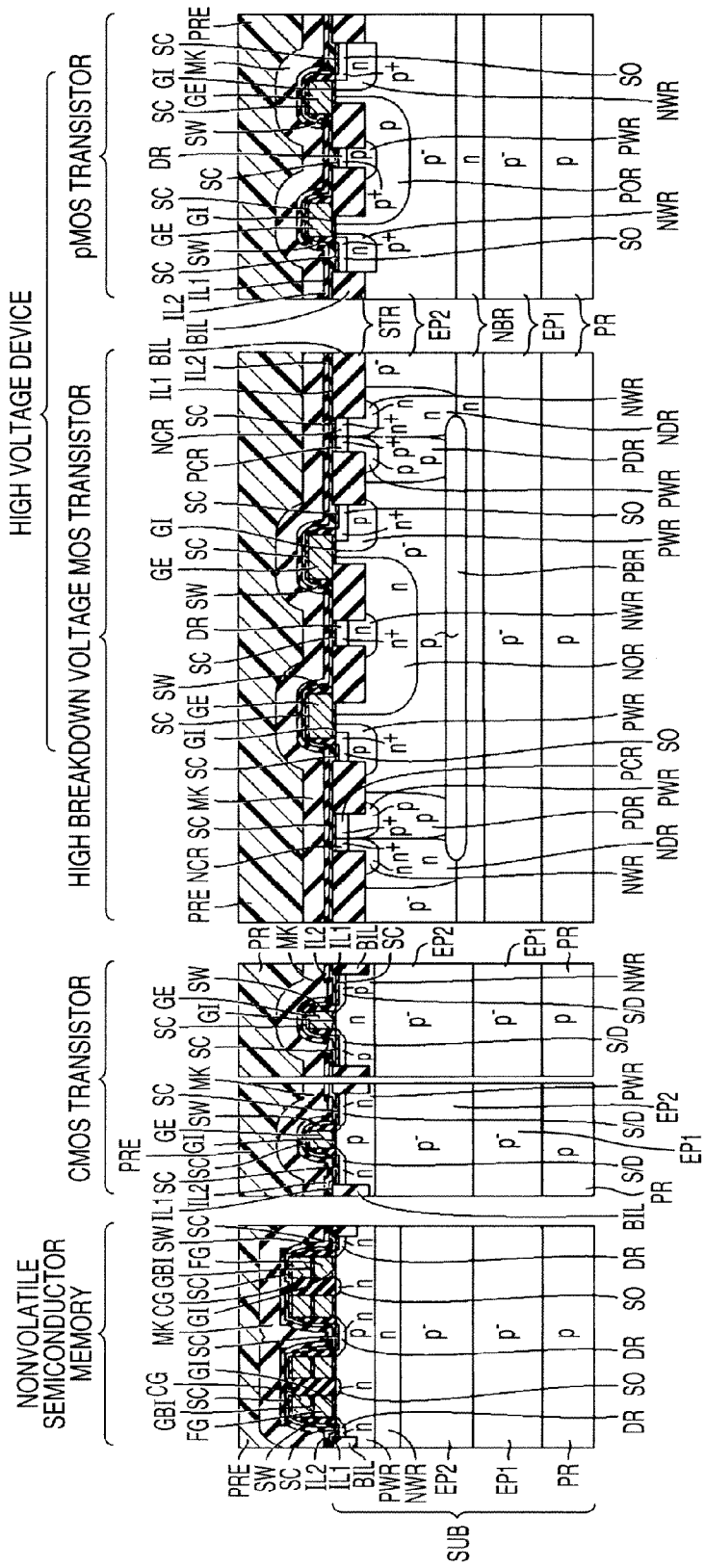
FIG. 5 is a schematic sectional view showing a second step in the method for manufacturing the semiconductor device according to the first embodiment.

Referring to FIG. 5, an insulating film IL1, an insulating film IL2 and a mask film MK are stacked in a manner to cover the device. The insulating film IL1 may be a non-doped silicon oxide film with a thickness of 20 nm. The insulating film IL2 may be a silicon nitride film with a thickness of 50 nm. The mask film MK may be a non-doped silicon oxide film with a thickness of 700 nm. Photo-resist PRE is coated on the mask film MK.

Figure 6:
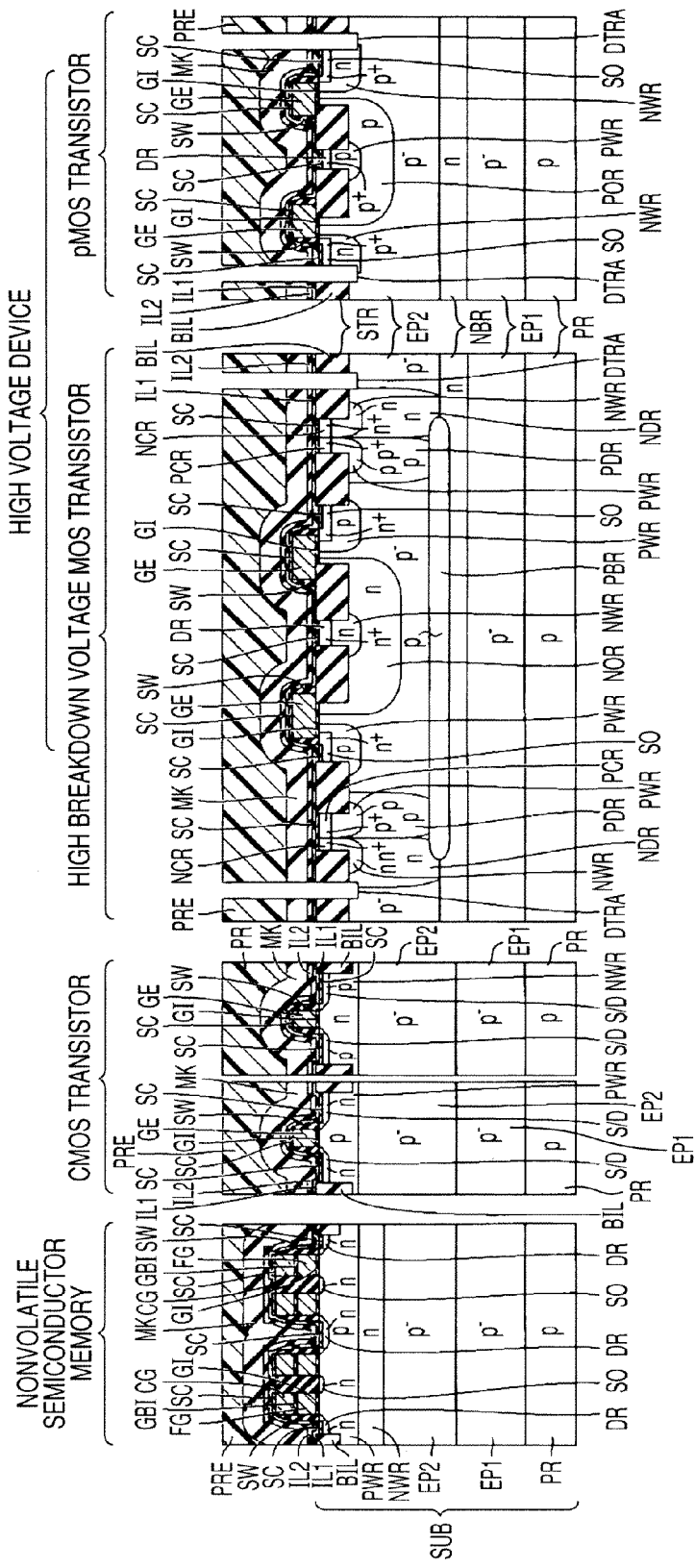
FIG. 6 is a schematic sectional view showing a third step in the method for manufacturing the semiconductor device according to the first embodiment.

Referring to FIG. 6, patterning with photo-resist PRE is done by an ordinary photoengraving technique. Using the resist pattern PRE made by this patterning process as a mask, anisotropic etching is performed on the mask film MK, insulating film IL2, insulating film IL1, and STI structure in order. Consequently, a trench DTRA is formed in the surface of the semiconductor substrate SUB.

Figure 7:
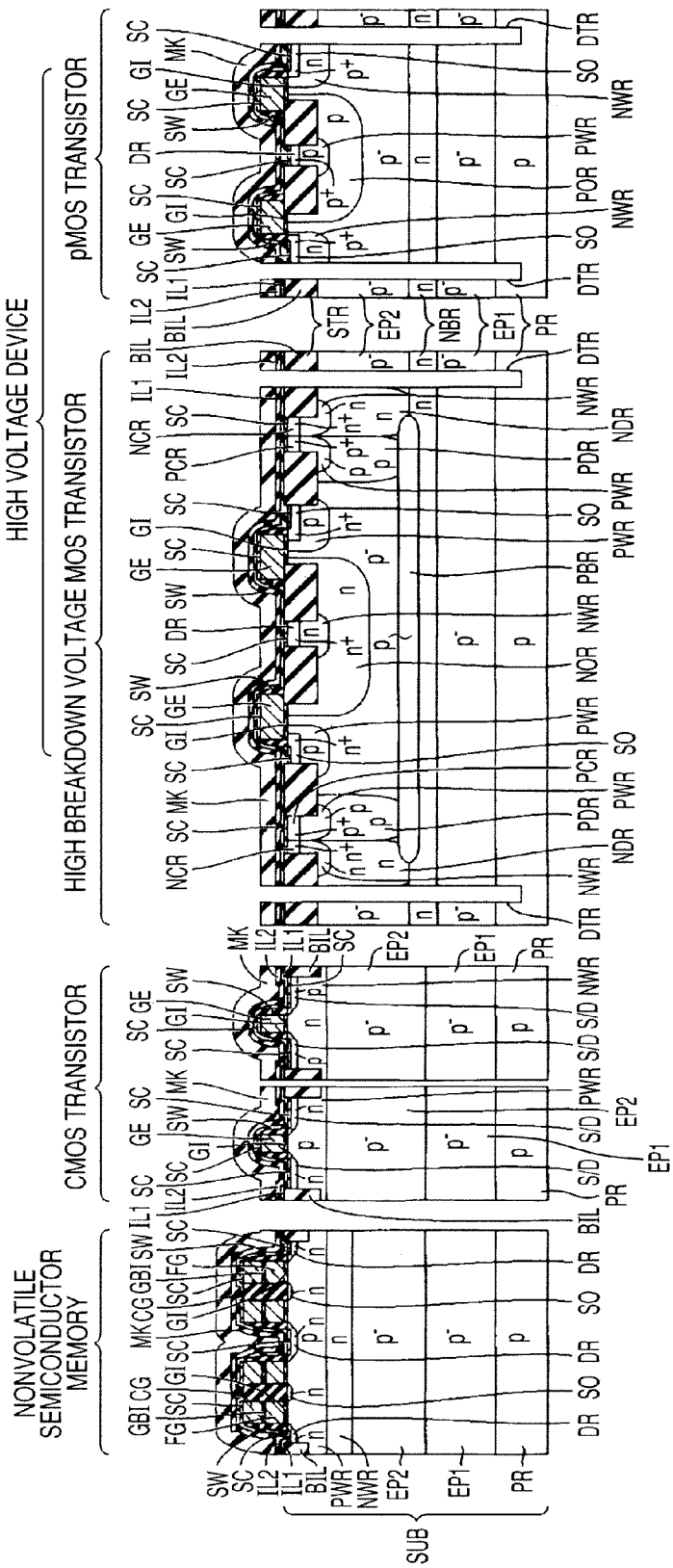
FIG. 7 is a schematic sectional view showing a fourth step in the method for manufacturing the semiconductor device according to the first embodiment.

Referring to FIG. 7, anisotropic etching is then performed on the semiconductor substrate SUB using the mask film MK as a mask. Consequently, a trench DTR is formed in a manner to penetrate the p⁻ epitaxial region EP2, n-type buried region NBR and p⁻ epitaxial region EP1 from the surface of the semiconductor substrate SUB and reach the p-type region PR. After that, the mask film MK is removed by isotropic etching.

Figure 8:
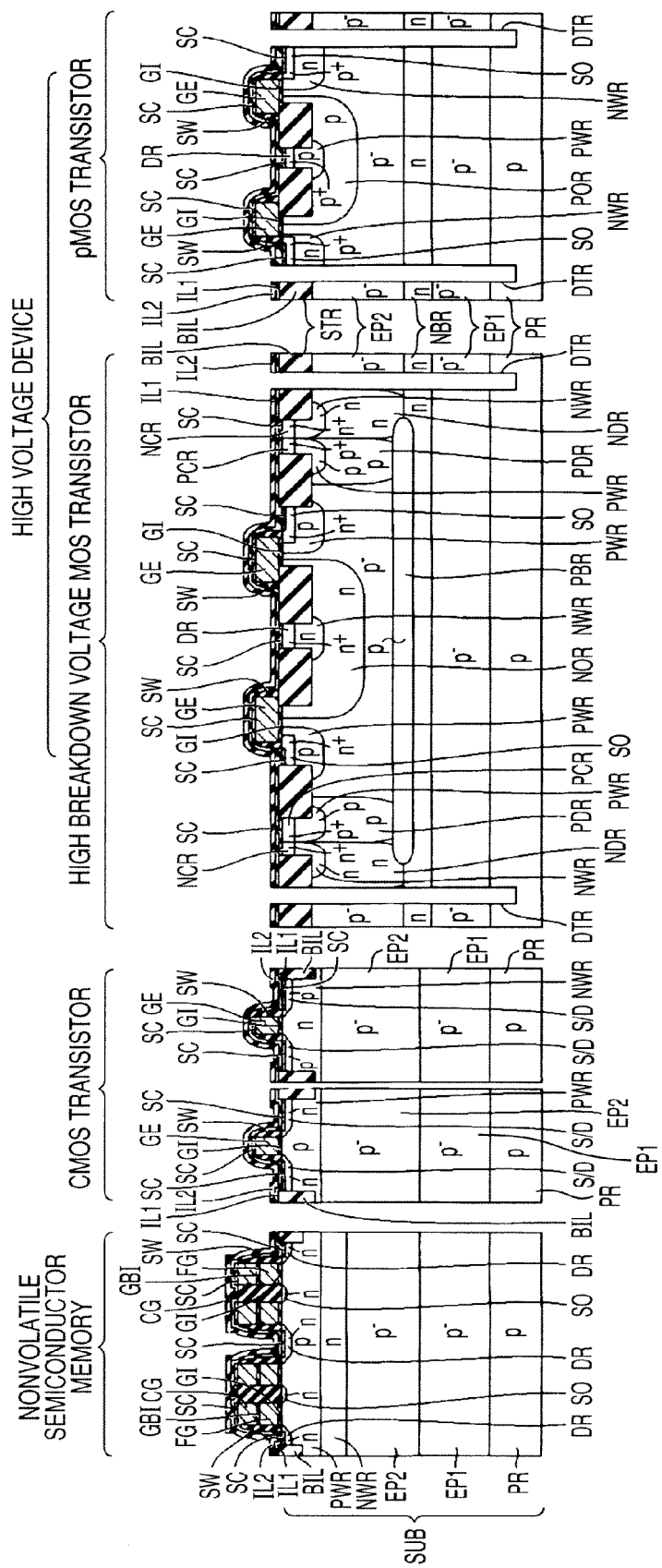
FIG. 8 is a schematic sectional view showing a fifth step in the method for manufacturing the semiconductor device according to the first embodiment.

Referring to FIG. 8, as a result of the above isotropic etching process, the upper surface of the insulating film IL2 is exposed and the buried insulating film BIL of the STI structure which is exposed on the wall surface of the trench DTR is depleted (retracted) laterally as seen in the figure.

Figure 9:
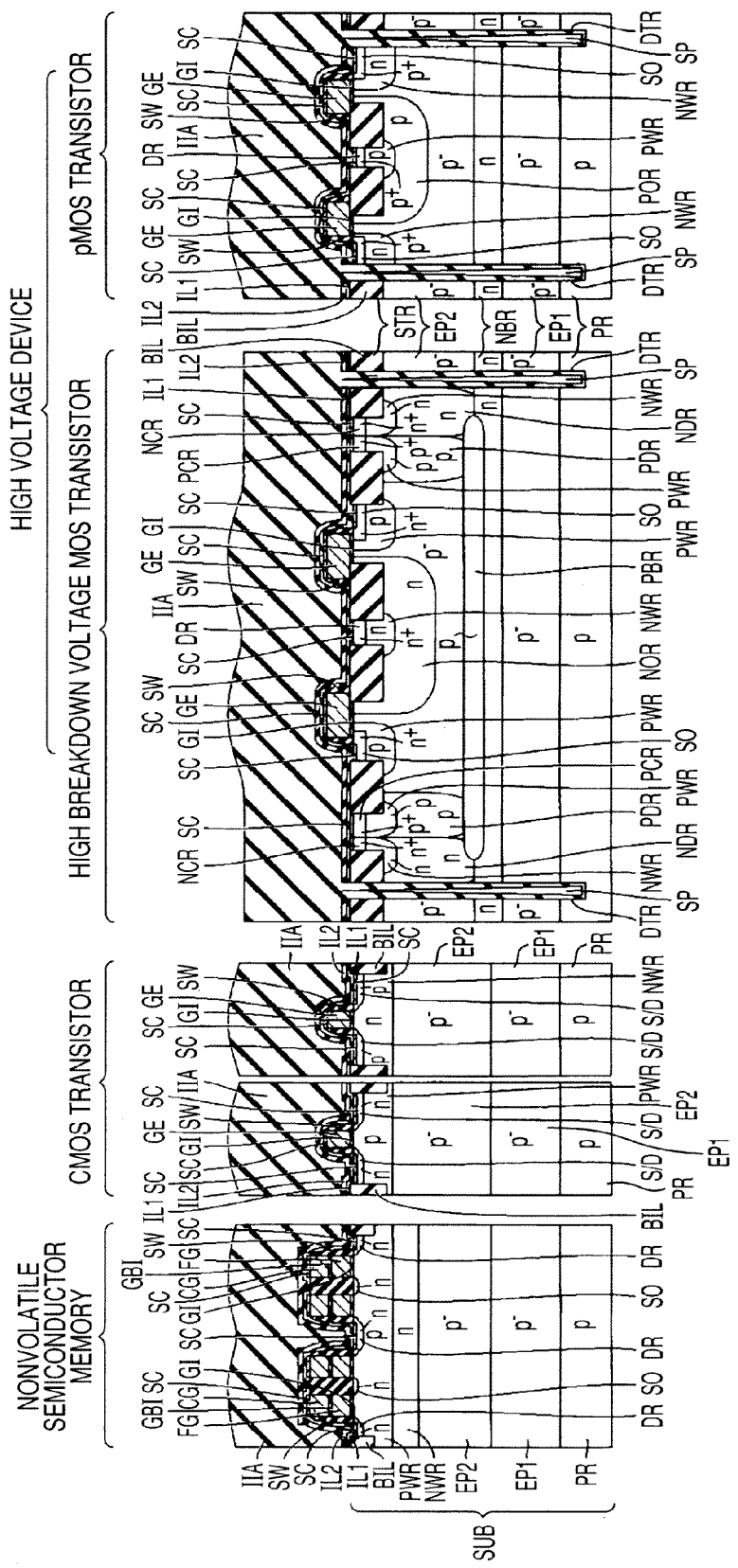
FIG. 9 is a schematic sectional view showing a sixth step in the method for manufacturing the semiconductor device according to the first embodiment.

Referring to FIG. 9, an insulating film IIA is formed over each device and in the trench DTR in a manner to cover the device and form an air-gap space SP inside the trench DTR. This insulating film IIA may be a BP-TEOS film with a thickness of 1450 nm. The upper surface of the insulating film IIA is flattened, for example, by CMP (chemical mechanical polishing). As a consequence, the thickness of the insulating film IIA becomes, for example, 750 nm.

Figure 10:
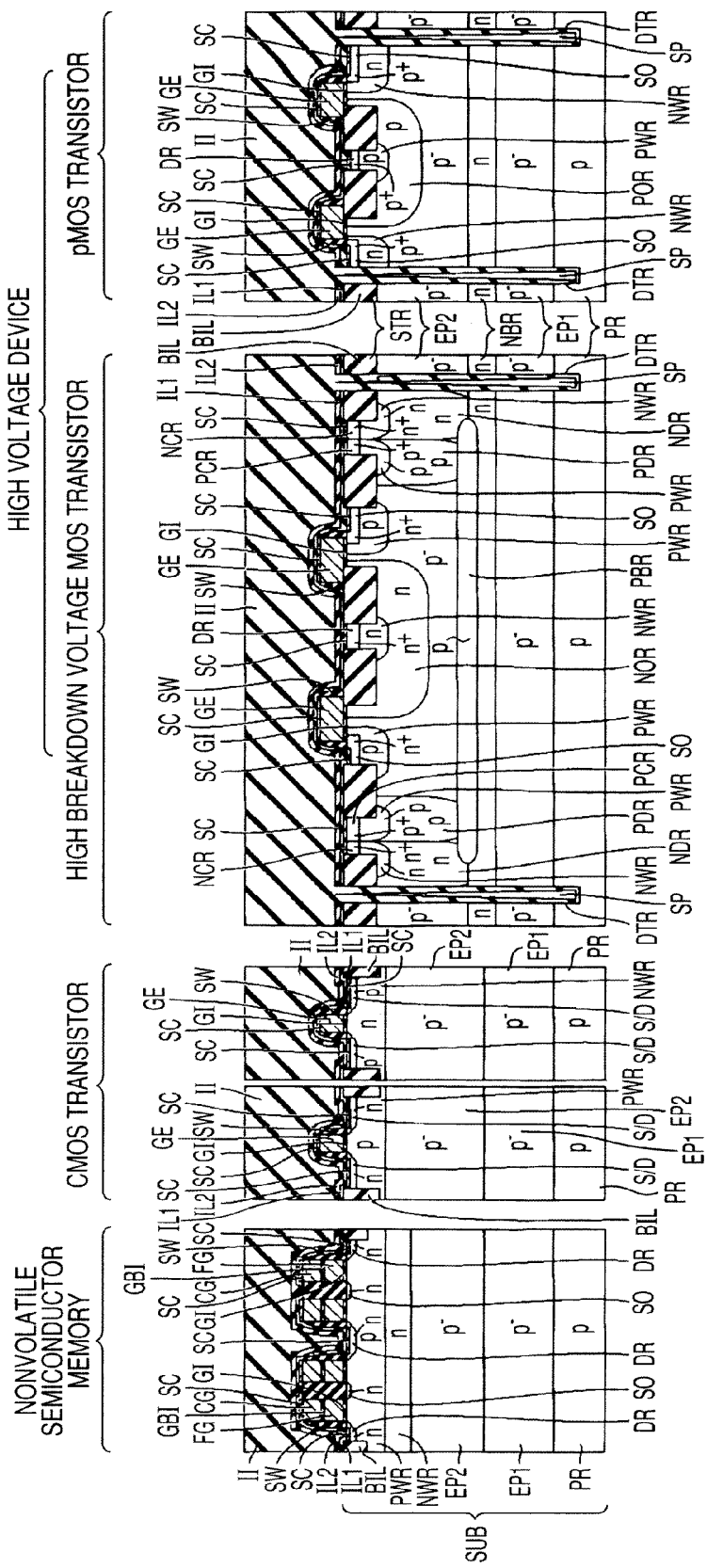
FIG. 10 is a schematic sectional view showing a seventh step in the method for manufacturing the semiconductor device according to the first embodiment.

Referring to FIG. 10, a silicon oxide film is formed over the insulating film IIA by a plasma CVD process. The insulating film IIA and the silicon oxide film thus formed by the plasma CVD process make up an interlayer insulating film II.

Figure 11:
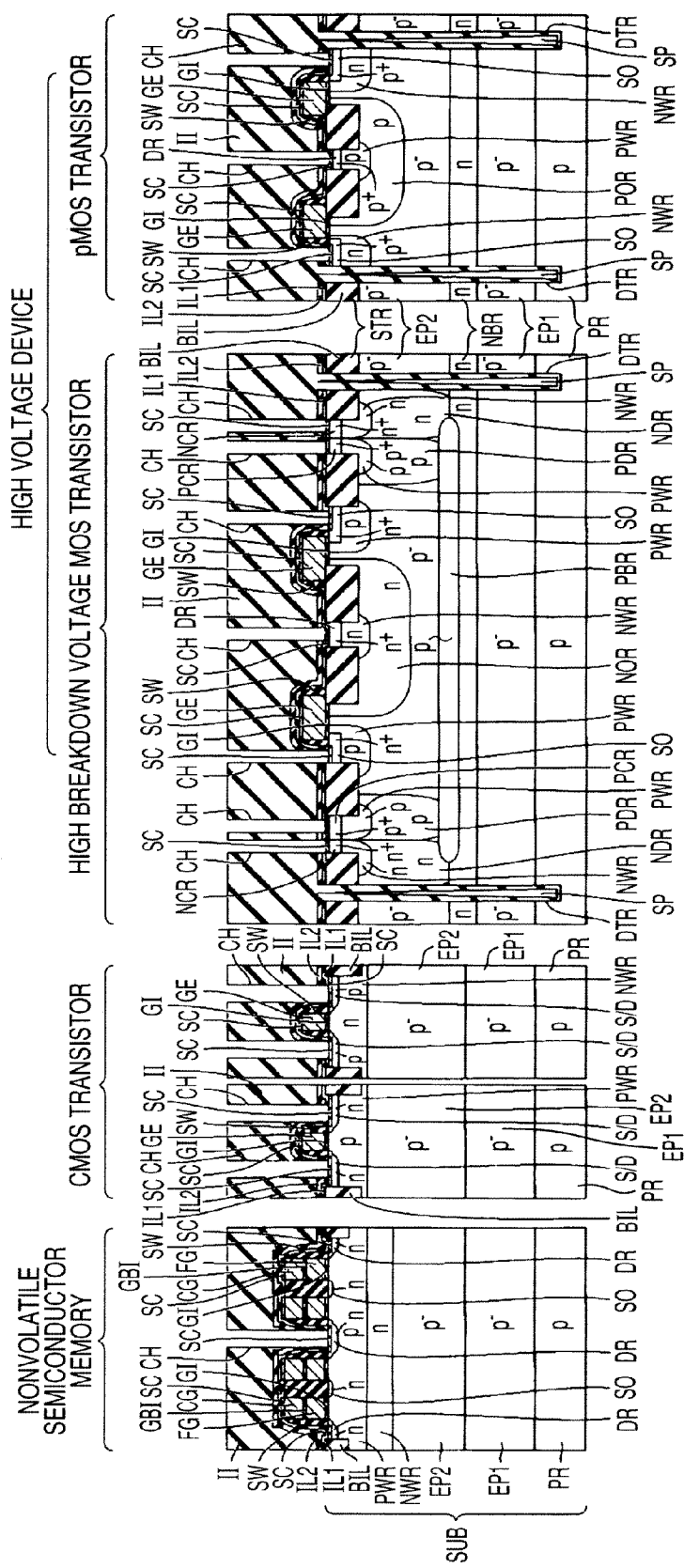
FIG. 11 is a schematic sectional view showing an eighth step in the method for manufacturing the semiconductor device according to the first embodiment.

Referring to FIG. 11, a contact hole CH is made by an ordinary photoengraving technique and an etching technique in a manner to penetrate the interlayer insulating film II, insulating film IL2 and insulating film IL1 and reach the surface of the semiconductor substrate SUB. For example, the surface of the silicide layer SC formed on the surfaces of the source and drain regions is exposed through this contact hole CH.

Figure 12:
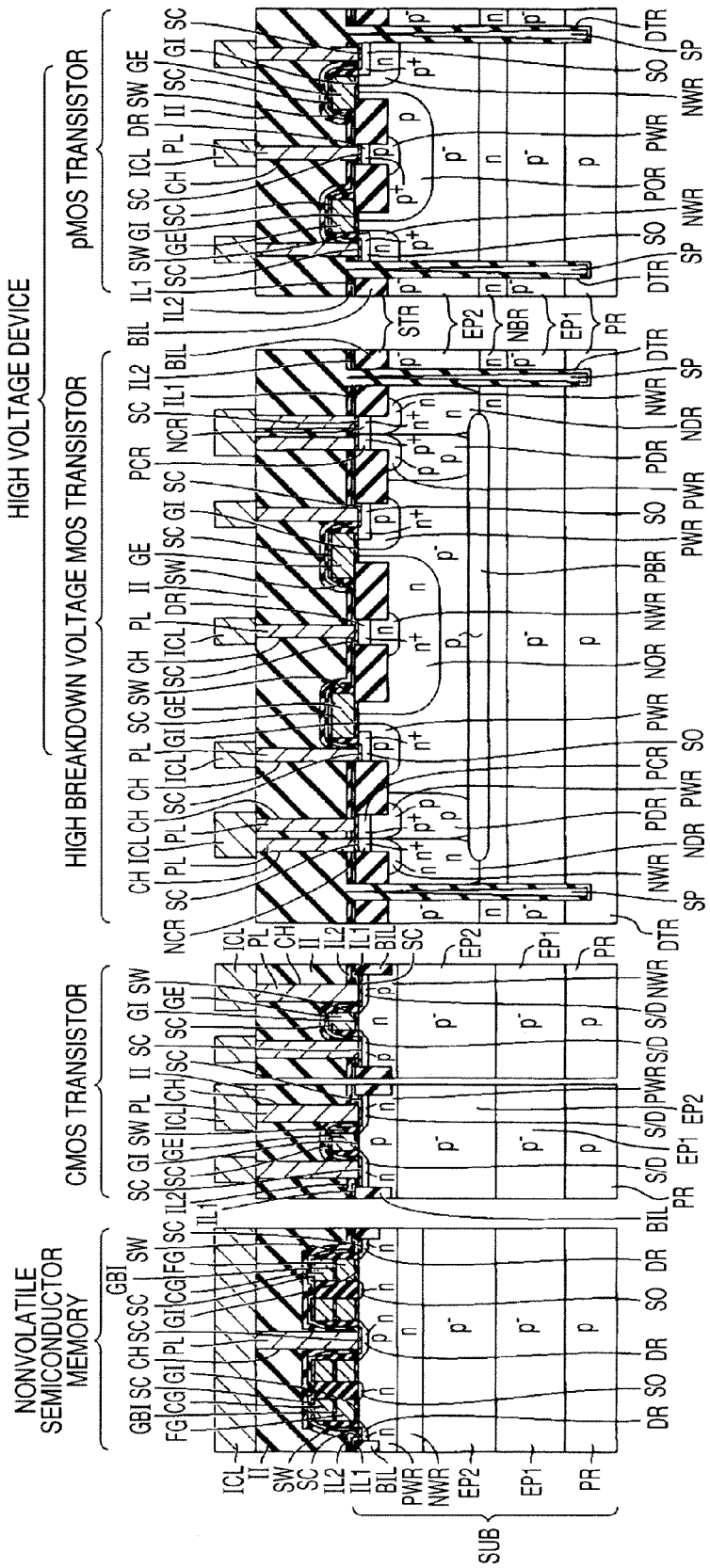
FIG. 12 is a schematic sectional view showing a ninth step in the method for manufacturing the semiconductor device according to the first embodiment.

Referring to FIG. 12, a plug conductive layer PL is formed in the contact hole CH. After that, an interconnect layer ICL is formed over the interlayer insulating film II for electric coupling with the conductive portion of the device through the plug conductive layer PL.

The semiconductor device according to this embodiment is manufactured by the above procedure. Next, an explanation will be given of the result of the inventors' tests to investigate differences in characteristics (leak current, breakdown voltage, field intensity distribution at breakdown) between a DTI structure with an air-gap space in a trench DTR (air-gap structure) and one without such a space (solid structure).

Figure 13:
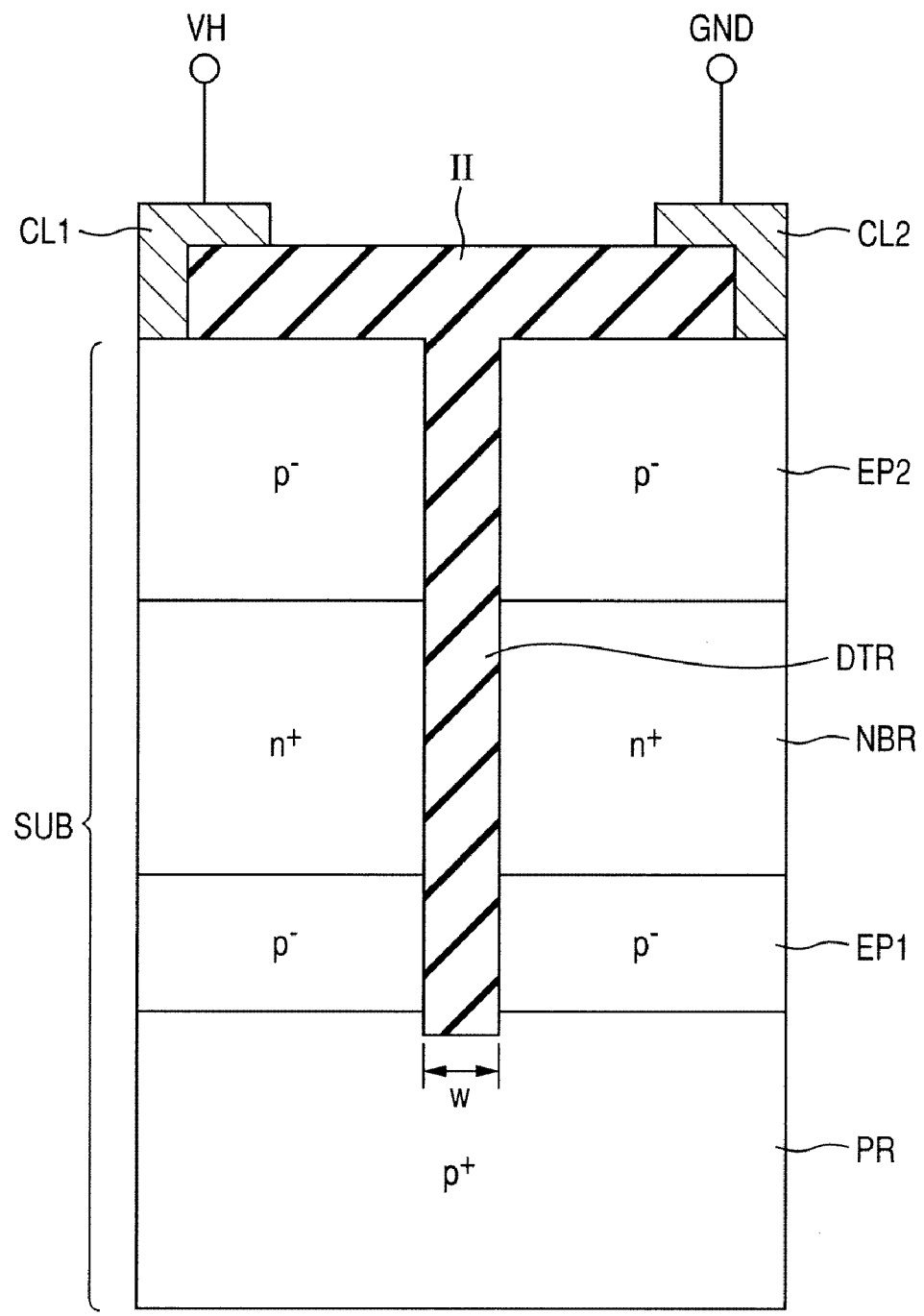
FIG. 13 is a schematic sectional view showing the structure of a sample used in a device evaluation test for comparison between an air-gap DTI structure and a solid DTI structure.

First, samples which were used in the above tests to investigate the characteristics are explained below referring to FIG. 13. In the sample as shown in FIG. 13, a p$^-$ epitaxial region EP1, an n-type buried region NBR, and a p$^-$ epitaxial region EP2 are stacked over a p-type region PR of a semiconductor substrate SUB. A trench DTR is formed in the semiconductor substrate SUB in a manner to penetrate the p$^-$ epitaxial region EP1, n-type buried region NBR, and p$^-$ epitaxial region EP2 from its surface and reach the p-type region PR. An insulating film II is formed in this trench DTR. One side of the p$^-$ epitaxial region EP2 with respect to the trench DTR is electrically coupled with a conductive layer CL1 and the other side is electrically coupled with a conductive layer CL2.

Figure 14:
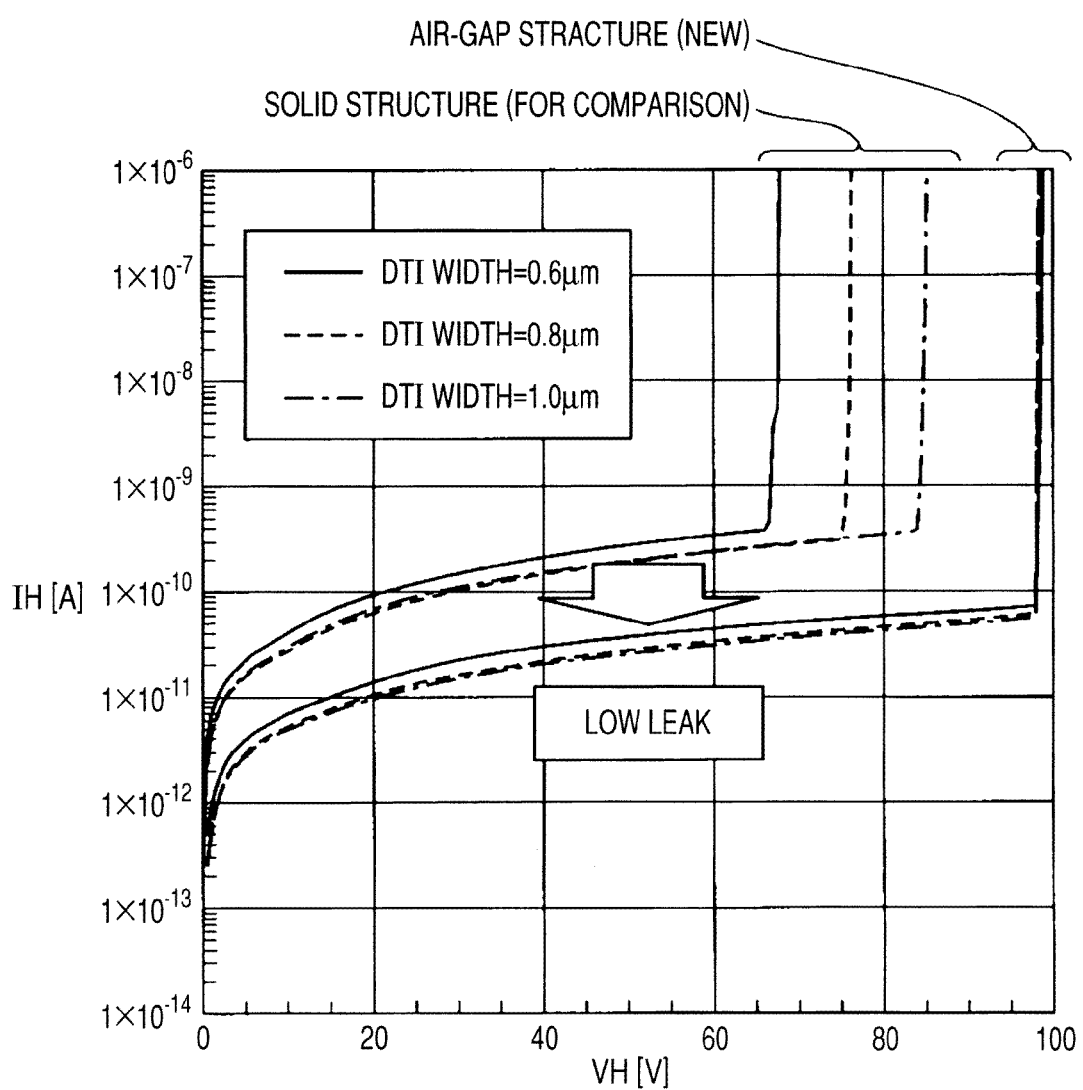
FIG. 14 shows the result of a test in which, with voltage applied to one terminal of the sample shown in FIG. 13, the current flowing in the other terminal was measured.

The inventors measured leak currents IH flowing between the conductive layers CL1 and CL2 when the voltage VH applied to the conductive layer CL1 was changed under the following different sample conditions: the width of the trench DTR (DTI width) W was 0.6 μm, 0.8 μm and 1.0 μm. FIG. 14 shows the result of the test.

Referring to FIG. 14, whereas the leak current was found to be between $1 \times 10^{-10}$ A and $1 \times 10^{-9}$ A regardless of the width W of the trench DTR when the trench DTR had no air-gap space SP, the leak current was found to be less than $1 \times 10^{-10}$ A when the trench DTR had an air-gap space SP. This demonstrates that the leak current is lower when the trench DTR has an air-gap space SP than when it has no air-gap space SP.

The inventors conducted a test to find how the breakdown voltage changes according to the width W of the trench DTR (DTI width). FIG. 15 shows the result of the test.

Referring to FIG. 15, when the trench DTR had no air-gap space SP, the breakdown voltage BV rose as the width W of the trench DTR was changed from 0.6 μm to 0.8 μm to 1.0 μm, but it was 85 V or less regardless of the width.

On the other hand, when the trench DTR had an air-gap space SP, the breakdown voltage BV remained virtually unchanged even though the width W of the trench DTR was changed (0.6 μm, 0.8 μm, 1.0 μm), but it was between 95 V and 100 V. This demonstrates that the breakdown voltage BV is higher when the trench DTR has an air-gap space SP than when it has no air-gap space SP.

Furthermore, a test on field intensity distributions at breakdown in the samples was conducted by isolation breakdown voltage simulations for comparison between a DTI structure with an air-gap space in a trench DTR and one without an air-gap space therein. FIGS. 16A and 16B and FIGS. 17A and 17B show the result of the test.

Referring to FIGS. 16A and 16B, in the case that the DTI structure had no air-gap space SP in the trench DTR, it was found that the field intensity was the highest in the vicinity of the interface between the n$^+$ buried region NB and p$^-$ epitaxial region EP1 which are in contact with the trench DTR. At this time the breakdown voltage BV was 93 V.

Referring to FIGS. 17A and 17B, in the case that the DTI structure had an air-gap space SP in the trench DTR, it was found that the field intensity was lower in the vicinity of the interface between the n$^+$ buried region NB and p$^-$ epitaxial region EP1 which were in contact with the trench DTR, than in the case shown in FIGS. 16A and 16B. At this time the breakdown voltage BV was 126 V and higher than in the case shown in FIGS. 16A and 16B.

These findings reveal that the filed intensity in an area in contact with the trench DTR is lower and the breakdown voltage is higher when the trench DTR has an air-gap space SP than when it has no air-gap space SP.

Next, the advantageous effects of this embodiment will be described. According to this embodiment, since the trench DTR of the DTI structure is formed after completion of a device such as a high breakdown voltage lateral MOS transistor as shown in FIGS. 4 to 7, the trench DTR can be filled with the interlayer insulating film II. This makes it unnecessary to form an insulating film to fill the trench DTR in addition to the interlayer insulating film, leading to a substantial reduction in the number of manufacturing steps.

When the trench DTR of the DTI structure is formed after completion of a device such as a high breakdown voltage lateral MOS transistor, there is another advantageous effect. The surface of the insulating film to be filled in the trench DTR is less frequently subjected to wet etching in the manufacturing steps after completion of the device than in the manufacturing steps before completion of the device. For this reason, even when there is an air-gap space SP inside the trench DTR, the space SP is less likely to be exposed on the substrate surface. Consequently it is unlikely that foreign substance such as photo-resist may get into the space SP exposed on the substrate surface, which prevents a pattern defect due to spout of foreign substance from the air-gap space SP during the manufacturing process.

Furthermore, since the air-gap space SP in the trench DTR is unlikely to be exposed on the surface, there is no problem with the existence of the air-gap space SP in the trench DTR. Therefore, the trench DTR need not have a high fillability, so the number of manufacturing steps can be decreased.

In addition, by making an air-gap space SP in the trench DTR purposely, leak currents of the devices isolated by DTI structures are reduced, breakdown voltages are increased and the field intensity in an area in contact with the trench DTR is lowered, as explained referring to FIGS. 13 to 17B.

Furthermore, by making an air-gap space SP in the trench DTR, the influence of an electric field from an adjacent device which hampers expansion of a depletion layer (reverse field plate effect) is suppressed and as a consequence the isolation breakdown voltage is increased. Also, by making an air-gap space SP in the trench DTR, stress in the trench DTR is reduced and crystal defects attributable to such stress are thus suppressed.

Furthermore, since a DTI structure is formed in a region where an STI structure exists, stress concentration on the opening of the trench DTR is relieved. This further suppresses crystal defects.

Second Embodiment

Although the first embodiment concerns a DTI structure which is formed in a region where an STI structure exists, a DTI structure may be formed in a region where no STI structure exists. The second embodiment, in which a DTI structure is formed in a region where no STI structure exists, is described below.

Figure 18:
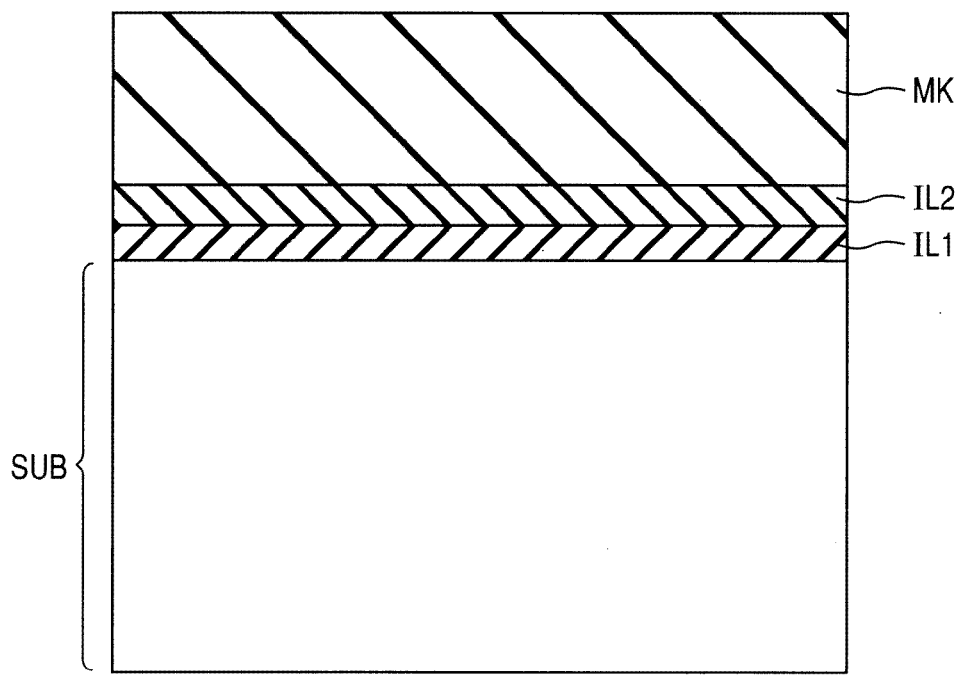
FIG. 18 is a schematic sectional view showing a first step in the method for manufacturing the semiconductor device according to a second embodiment of the invention.

Referring to FIG. 18, an insulating film IL1, an insulating film IL2 and a mask film MK are stacked over the surface of a semiconductor substrate SUB in order. This process corresponds to the steps before photo-resist PRE coating in the first embodiment as shown in FIG. 5.

Figure 19:
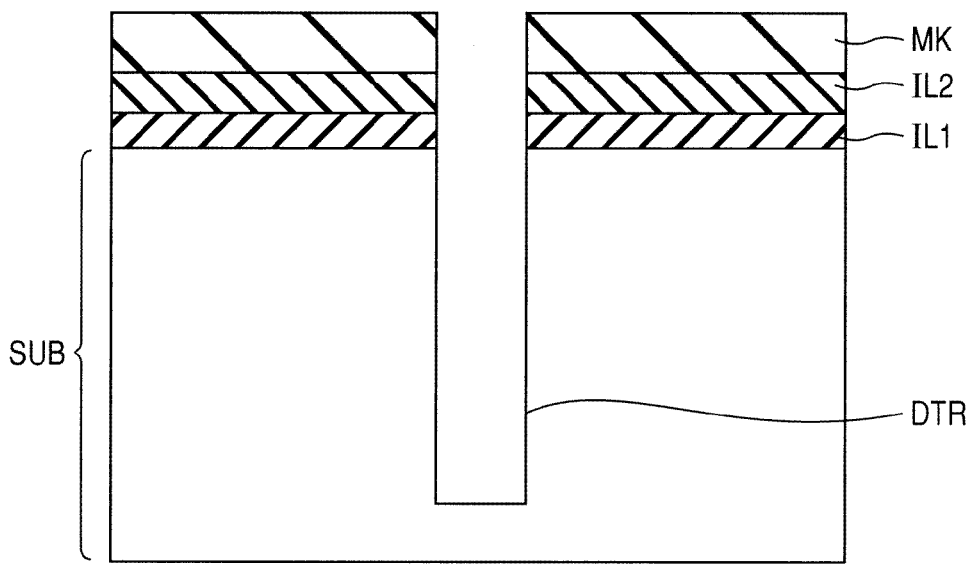
FIG. 19 is a schematic sectional view showing a second step in the method for manufacturing the semiconductor device according to the second embodiment.

Referring to FIG. 19, anisotropic etching is performed on the mask film MK, insulting film IL2 and insulating film IL1 in order by an ordinary photoengraving technique and an etching technique.

Then, anisotropic etching is performed on the semiconductor substrate SUB using the patterned mask film MK as a mask. Consequently, a trench DTR extending inward from the surface of the semiconductor substrate SUB is made. After that, the mask film MK is removed by isotropic etching.

Figure 20:
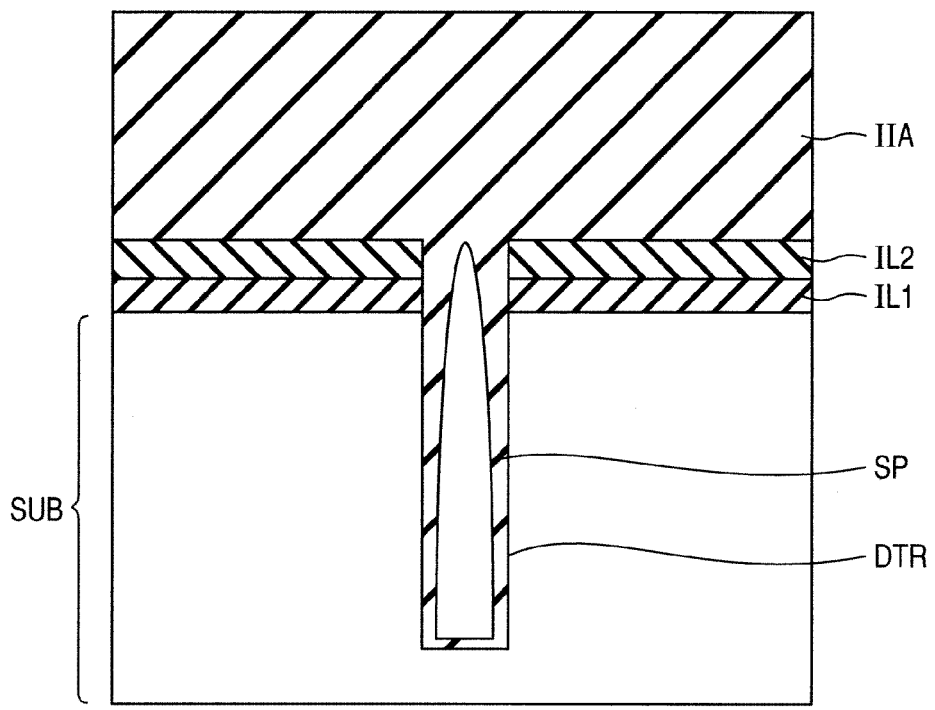
FIG. 20 is a schematic sectional view showing a third step in the method for manufacturing the semiconductor device according to the second embodiment.

Referring to FIG. 20, as a result of the above isotropic etching process, the upper surface of the insulating film IL2 is exposed. Insulating film IIA is formed over each device (not shown) and in the trench DTR in a manner to cover the device and form an air-gap space SP in the trench DTR. For example, this insulating film IIA is made of BP-TEOS.

After that, the same steps as those shown in FIGS. 10 to 12 in the first embodiment are carried out to manufacture a semiconductor device according to the second embodiment in which a DTI structure is formed in a region where no STI structure exists.

According to the second embodiment, the DTI structure can be applied to a simple device without an STI structure.

Third Embodiment

Although the mask film MK is removed by isotropic etching in the manufacturing process according to the second embodiment, the mask film MK need not necessarily be removed. The third embodiment, in which the mask film MK is not removed, is described below.

Figure 21:
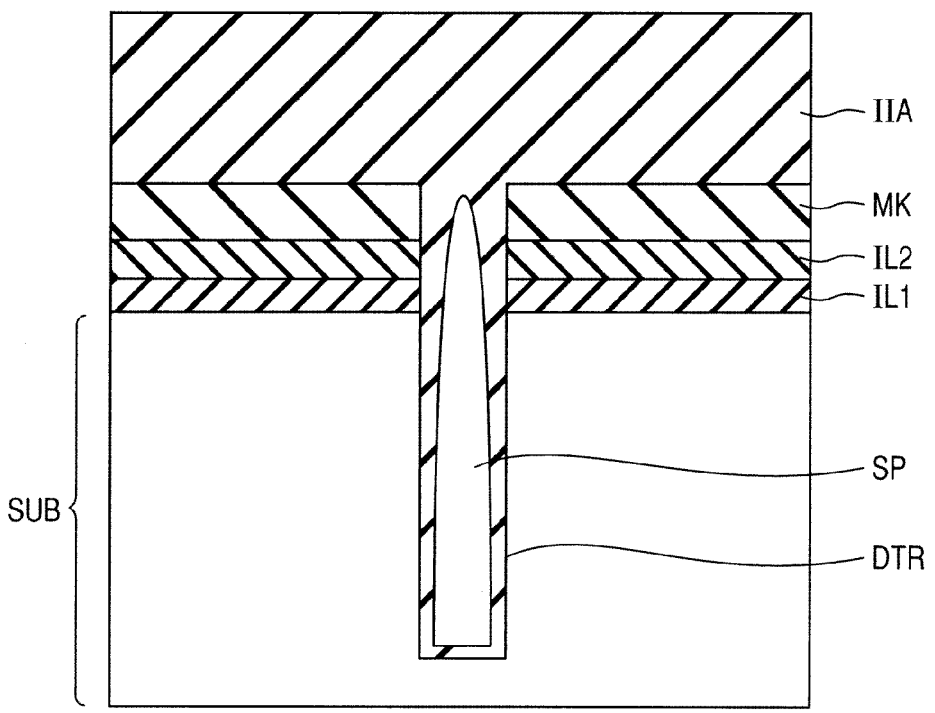
FIG. 21 is a schematic sectional view showing the method for manufacturing a semiconductor device according to a third embodiment of the invention.

The manufacturing method according to the third embodiment includes the same steps as shown in FIGS. 18 and 19 in the second embodiment. Referring to FIG. 21, after these steps, insulating film IIA is formed over the mask film MK and in the trench DTR in a manner to cover the device (not shown) and form an air-gap space SP in the trench DTR without removing the mask film MK.

Then, the same steps as those shown in FIGS. 10 to 12 in the first embodiment are carried out to manufacture a semiconductor device with the mask film MK not removed according to the third embodiment.

According to the third embodiment, the step of removing the mask film MK is omitted, leading to further cost reduction and shorter turnaround time.

Fourth Embodiment

Although the insulating film IL1, insulating film IL2 and mask film MK are stacked in the manufacturing process according to the second embodiment, the insulating film IL1 can be omitted. The fourth embodiment, in which the insulating film IL1 is omitted, is described below.

Figure 22:
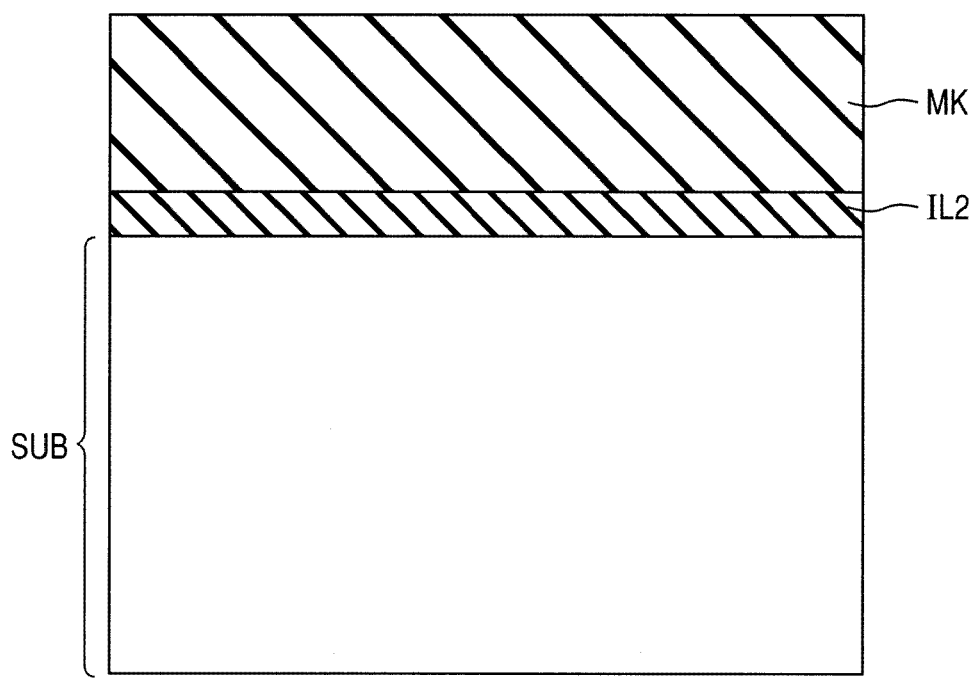
FIG. 22 is a schematic sectional view showing a first step in the method for manufacturing the semiconductor device according to a fourth embodiment of the invention.

Referring to FIG. 22, an insulating film IL2 and a mask film MK are stacked over the surface of a semiconductor substrate SUB in order. This process corresponds to the steps before photo-resist PRE coating as shown in FIG. 5 in the first embodiment.

Figure 23:
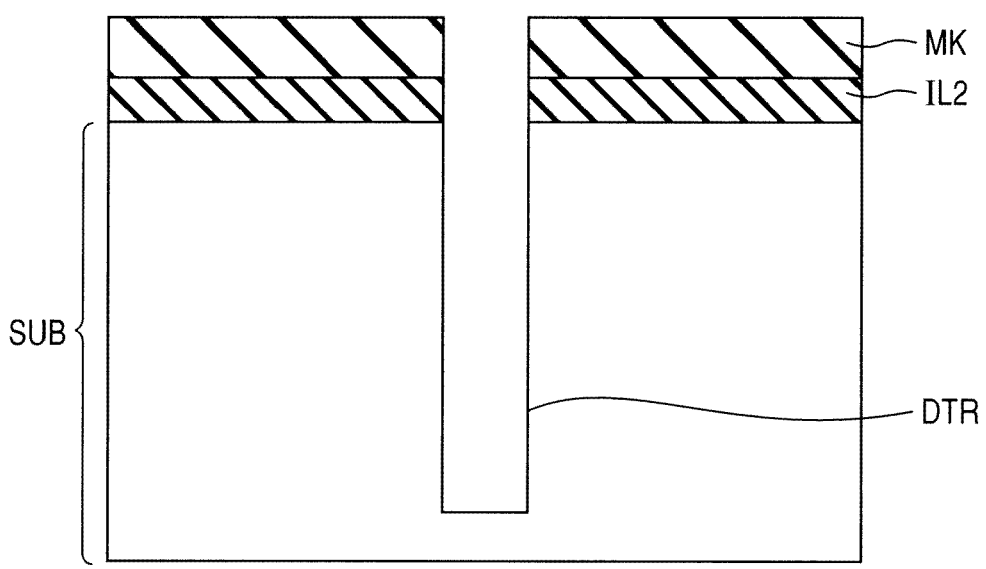
FIG. 23 is a schematic sectional view showing a second step in the method for manufacturing the semiconductor device according to the fourth embodiment.

Referring to FIG. 23, anisotropic etching is performed on the mask film MK and insulating film IL2 using an ordinary photoengraving technique and an etching technique.

Then, anisotropic etching is performed on the semiconductor substrate SUB using the mask film MK as a mask. Consequently, a trench DTR extending inward from the surface of the semiconductor substrate SUB is formed. After that, the mask film MK is removed by isotropic etching.

Figure 24:
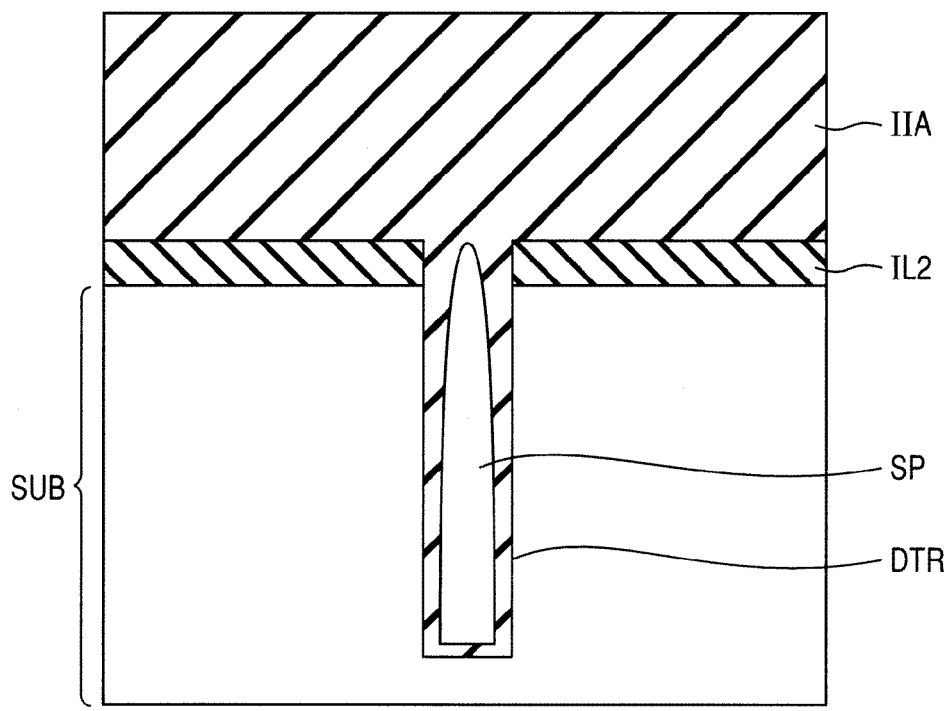
FIG. 24 is a schematic sectional view showing a third step in the method for manufacturing the semiconductor device according to the fourth embodiment.

Referring to FIG. 24, as a result of the isotropic etching process, the upper surface of the insulating film IL2 is exposed. Insulating film IIA is formed over each device and in the trench DTR in a manner to cover the device and form an air-gap space SP in the trench DTR.

After that, the same steps as those shown in FIGS. 10 to 12 in the first embodiment are carried out to manufacture a semiconductor device according to the fourth embodiment in which the insulating film IL1 is omitted.

According to the fourth embodiment, since the insulating film IL1 is omitted, further cost reduction and shorter turnaround time can be achieved.

Fifth Embodiment

Although the insulating film IL1, insulating film IL2 and mask film MK are stacked in the manufacturing process according to the third embodiment, the insulating film IL1 and insulating film IL2 can be omitted. The fifth embodiment, in which the insulating film IL1 and insulating film IL2 are omitted, is described below.

Figure 25:
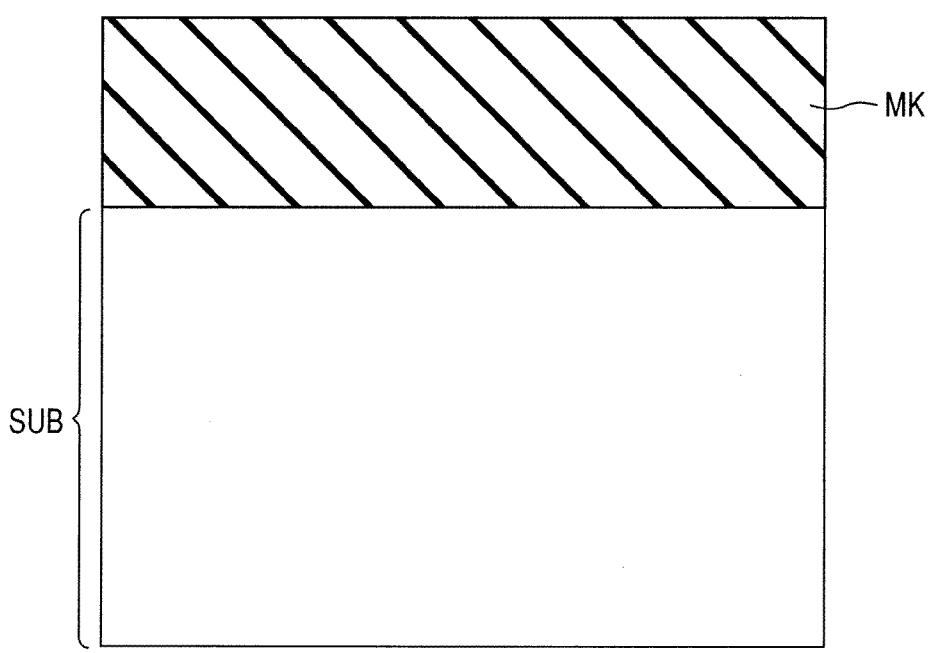
FIG. 25 is a schematic sectional view showing a first step in the method for manufacturing the semiconductor device according to a fifth embodiment of the invention.

Referring to FIG. 25, a mask film MK is formed in a manner to contact the surface of a semiconductor substrate SUB directly. This step corresponds to the step before photo-resist PRE coating as shown in FIG. 5 in the first embodiment.

Figure 26:
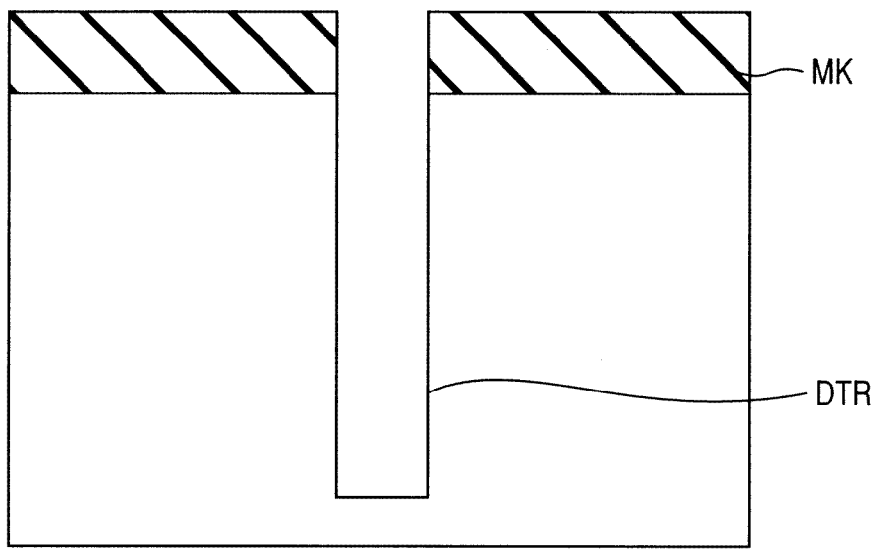
FIG. 26 is a schematic sectional view showing a second step in the method for manufacturing the semiconductor device according to the fifth embodiment.

Referring to FIG. 26, anisotropic etching is performed on the mask film MK using an ordinary photoengraving technique and an etching technique.

Then, anisotropic etching is performed on the semiconductor substrate SUB using the mask film MK as a mask. Consequently, a trench DTR extending inward from the surface of the semiconductor substrate SUB is formed.

Figure 27:
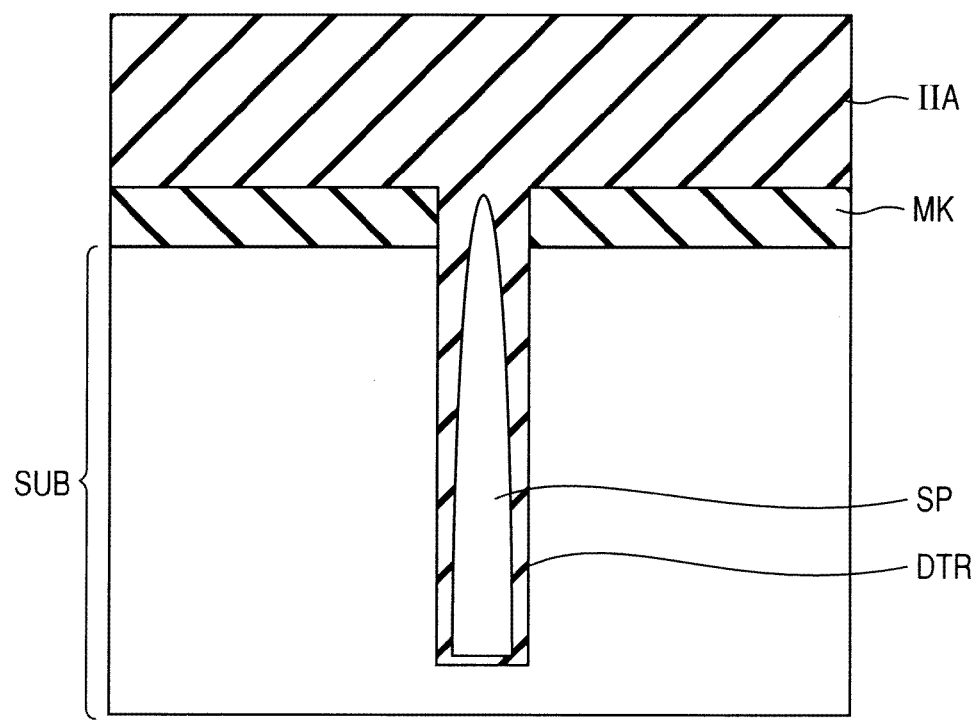
FIG. 27 is a schematic sectional view showing a third step in the method for manufacturing the semiconductor device according to the fifth embodiment.

Referring to FIG. 27, while the mask film MK is left or not removed, insulating film IIA is formed over the mask MK and in the trench DTR in a manner to cover each device and form an air-gap space SP in the trench DTR.

After that, the same steps as those shown in FIGS. 10 to 12 in the first embodiment are carried out to manufacture a semiconductor device according to the fifth embodiment in which the insulating film IL1 and insulating film IL2 are omitted.

According to the fifth embodiment, since the insulating film IL1 and insulating film IL2 are omitted, further cost reduction and shorter turnaround time can be achieved.

Sixth Embodiment

Figure 28:
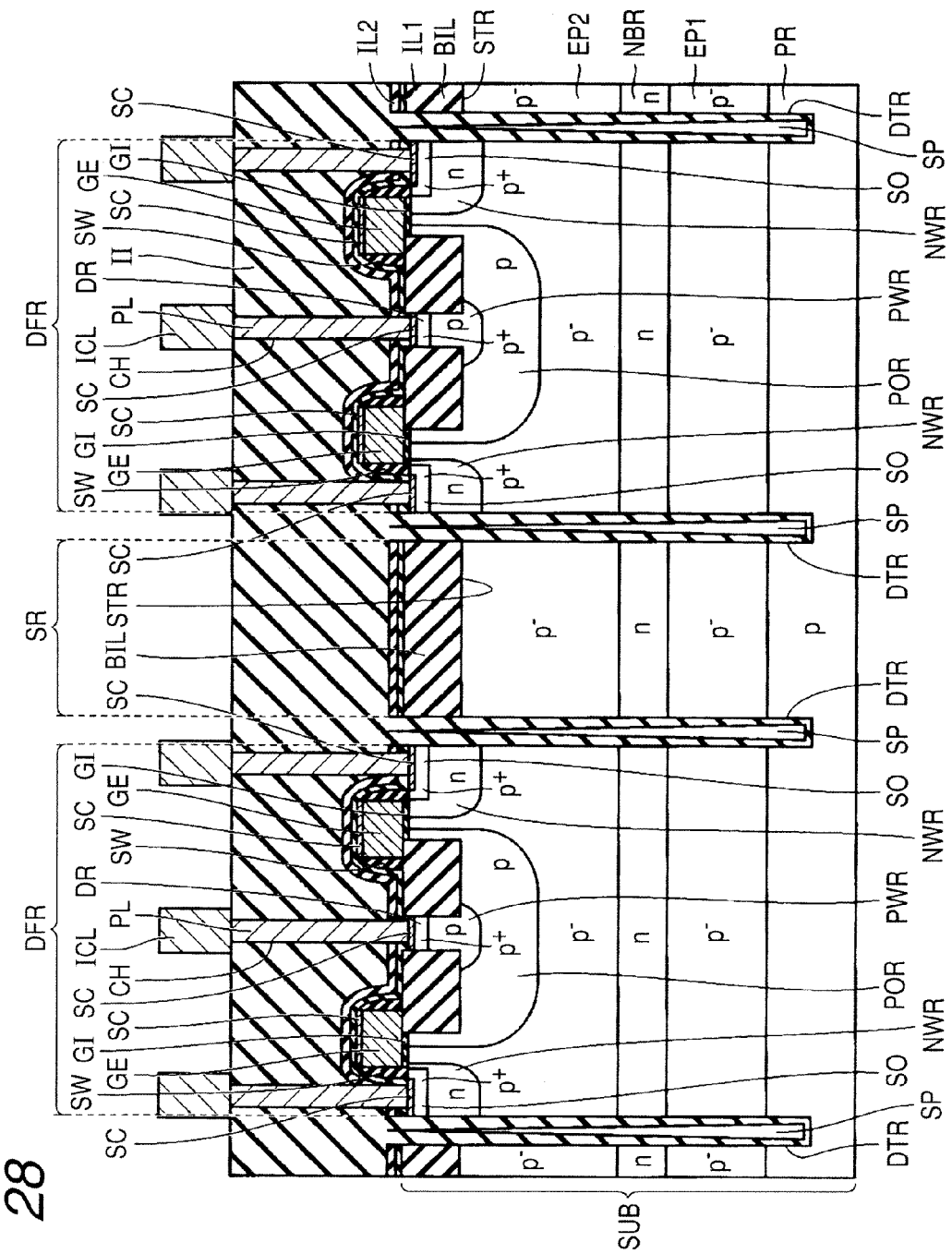
FIG. 28 is a schematic sectional view showing an example of isolation by DTI.

As shown in FIG. 28, device formation regions DFR (pMOS transistor formation regions in the case shown in the figure), each surrounded by a DTI structure, may be adjacent to each other with a specific region (SR) between them. In this case, an STI structure may be formed on the surface of the semiconductor substrate SUB in the specific region SR. As described earlier, the STI structure includes a trench STR formed in the surface of the semiconductor substrate SUB and an insulating film BIL buried in the trench STR.

Figure 29:
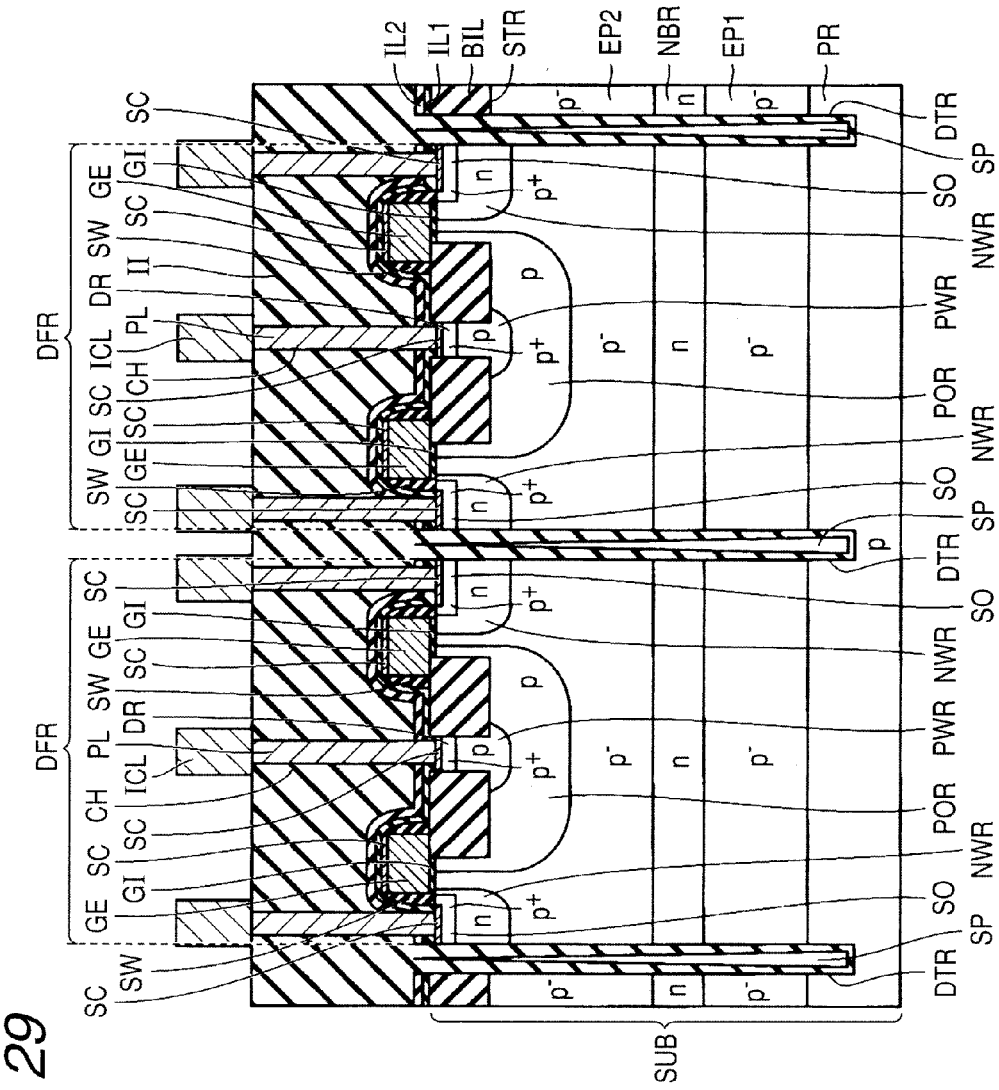
FIG. 29 is a schematic sectional view showing another example of isolation by DTI.
Figure 30:
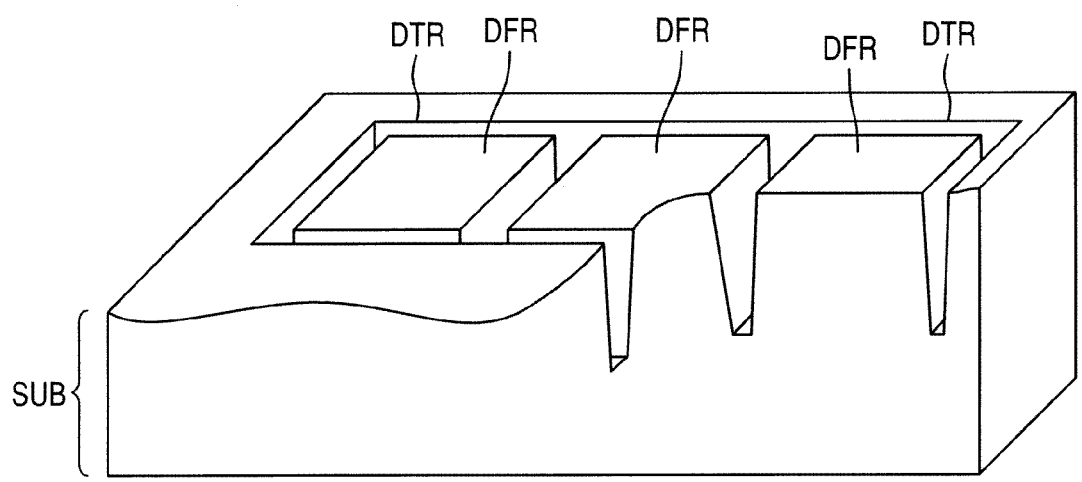
FIG. 30 is a partially sectional perspective view showing a further example of isolation by DTI.

As shown in FIGS. 29 and 30, it is also possible that device formation regions DFR, each surrounded by a DTI structure, are adjacent to each other with only one trench DTR between them.

When only one trench lies between device formation regions DFR, it is preferable that devices formed in neighboring device formation regions be of the same type. In other words, if a pMOS transistor is formed in a device formation region, it is preferable that a pMOS transistor be formed in a device formation region adjacent to that region.

If devices of the same type are formed in neighboring device formation regions DFR as mentioned above, the same well regions (n-type well region in the case of a pMOS transistor) are located on both sides of the trench DTR lying between the device formation regions, eliminating the possibility of a problem related to well region diffusion before formation of the trench DTR.

In the above explanations of the first to sixth embodiments, it has been assumed that the device to be formed in a device formation region DFR is a high breakdown voltage MOS transistor. However, the present invention may also be applied to IGBTs (insulated gate bipolar transistors) and diodes and other types of high breakdown voltage devices.

"Completion of a device" in the manufacturing process means that main components which are required for the device to perform its function have been formed. More specifically, if the device is a diode, completion of the device means that an anode region and a cathode region have been formed; if the device is an MIS (metal insulation semiconductor) transistor, it means that a source region, a drain region, a gate insulating film, and a gate electrode have been formed; and if the device is an IGBT, it means that an emitter region, a base region, a drift region, a collector region, a gate insulating film and a gate electrode have been formed.

In the explanations of the first to sixth embodiments, it has been assumed that the interlayer insulating film II is, for example, a laminate comprised of BP-TEOS and a silicon oxide film formed by plasma CVD. However, the interlayer insulating film II is not limited thereto but it may be made of different materials or be a single-layer film. The interlayer insulating film formed in the trench DTR is intended for electric isolation between a device in a lower layer and a conductive layer in an upper layer such as an interconnect, and includes a film whose upper surface is flattened.

In all the foregoing embodiments, if it is necessary to prevent solid phase diffusion of B (boron) or P (phosphor) in the interlayer insulating film II, an insulating film (liner film), such as a silicon oxide film or silicon nitride film, may be formed on the inner wall of the trench DTR by oxidization or nitridation or CVD before deposition of the interlayer insulating film II.

It should be considered that the embodiments disclosed herein are all illustrative and not restrictive. It should be understood that the scope of the invention is defined by the appended claims rather than by the above description, and all changes that fall within metes and bounds of the claims, or equivalence of such metes and bounds, are intended to be embraced by the claims.

The present invention is particularly effective when it is applied to the manufacture of a semiconductor device having a trench.

What is claimed is:

1. A method for manufacturing a semiconductor device comprising the steps of:
   completing a device with a conductive portion over a main surface of a semiconductor substrate;
   making a first trench surrounding the device when seen in a plan view, in the main surface of the semiconductor substrate;
   making a second trench in the first trench;
   forming an insulating film over the device and in the second trench so as to cover the device and make an air-gap space in the second trench; and
   making, in the insulating film, a hole which reaches the conductive portion of the device.

2. The method for manufacturing a semiconductor device according to claim 1, wherein the step of making the second trench comprises the steps of:
   forming a mask film over the main surface of the semiconductor substrate;
   patterning the mask film; and
   making the second trench in the main surface of the semiconductor substrate using the patterned mask film as a mask.

3. The method for manufacturing a semiconductor device according to claim 2, wherein the mask film is formed over the main surface of the semiconductor surface so as to contact the main surface directly.

4. The method for manufacturing a semiconductor device according to claim 2, wherein the step of making the second trench further comprises a step of forming a silicon nitride film between the main surface of the semiconductor substrate and the mask film.

5. The method for manufacturing a semiconductor device according to claim 4, wherein the step of making the second trench further comprises a step of forming a silicon oxide film between the main surface of the semiconductor substrate and the silicon nitride film.

6. The method for manufacturing a semiconductor device according to claim 2, wherein the insulating film is formed over the mask film.

7. The method for manufacturing a semiconductor device according to claim 2, further comprising a step of removing the mask film after formation of the second trench, wherein the insulating film is formed after removal of the mask film.

8. The method for manufacturing a semiconductor device according to claim 1, further comprising a step of making a third trench in the main surface of the semiconductor substrate,
   wherein the second trench is deeper in a region in which the third trench is formed, than the third trench.

9. A semiconductor device comprising:
   a semiconductor substrate having a trench in a main surface thereof;
   a device being formed over the main surface of the semiconductor substrate and having a conductive portion, the trench being formed so as to surround the device when seen in a plan view; and
   an insulating film being formed over the device and in the trench so as to cover the device and form an air-gap space in the trench, the insulating film having a hole which reaches the conductive portion,
   wherein a side surface of the trench on a same level of a bottom of the air-gap space directly contacts the semiconductor substrate.

* * * * *